US011982108B2

(12) United States Patent
Tan et al.

(10) Patent No.: US 11,982,108 B2
(45) Date of Patent: May 14, 2024

(54) SECURITY SYSTEM HAVING AN ELECTRONIC LOCK TO CONTROL ACCESS TO ELECTRONIC DEVICES

(71) Applicant: Hewlett Packard Enterprise Development LP, Houston, TX (US)

(72) Inventors: Chong S. Tan, Houston, TX (US); Joseph Allen, Houston, TX (US); John Norton, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 842 days.

(21) Appl. No.: 16/912,893

(22) Filed: Jun. 26, 2020

(65) Prior Publication Data
US 2021/0404216 A1  Dec. 30, 2021

(51) Int. Cl.
*E05B 47/06* (2006.01)
*E05C 3/16* (2006.01)
(Continued)

(52) U.S. Cl.
CPC ............ *E05B 47/0607* (2013.01); *E05C 3/16* (2013.01); *H05K 5/0221* (2013.01); *H05K 7/1485* (2013.01)

(58) Field of Classification Search
CPC ......... E05B 2047/0024; E05B 47/0607; E05B 47/0012; E05B 2047/0016;
(Continued)

(56) References Cited

U.S. PATENT DOCUMENTS 2,751,639 A * 6/1956 Oswald ................. E06B 3/28
292/241
6,307,738 B1 * 10/2001 Tran ................... E05B 73/0082
361/679.57
(Continued)

FOREIGN PATENT DOCUMENTS

| CN | 108447194 A | * | 8/2018 | ......... G06K 9/00255 |
| WO | WO-2004016888 A1 | | 2/2004 | |
| WO | WO-2011094736 A1 | * | 8/2011 | ........... E05B 17/007 |
| WO | WO-2017196319 A1 | * | 11/2017 | |
| WO | WO-2019226574 A1 | | 11/2019 | |

OTHER PUBLICATIONS

RCI 3525/3525PRX Rack Handle, (Web Page), Retrieved Feb. 28, 2020, 4 Pgs.

*Primary Examiner* — Victor D Batson
*Assistant Examiner* — Steven A Tullia
(74) *Attorney, Agent, or Firm* — Hewlett Packard Enterprise Patent Department

(57) ABSTRACT

Example implementations relate to a security system having an electronic lock including latch and security modules, to control access to electronic devices. The latch module includes a receiver, a handle, and a torque member rotatably coupled to the receiver and handle. The receiver includes a first recess, a second recess, and a lobe to releasably engage the electronic device within the first recess. The security module includes a tension spring, an actuator, and a lock member having a first pin and a second pin. The tension spring is coupled to the lock member to engage the first pin to second recess when the latch module is in a latched configuration, and hold the security module in a lock-in position. The actuator is releasably engaged to the second pin for rotating the lock member to disengage the first pin from second recess, and release the security module from the lock-in position.

20 Claims, 14 Drawing Sheets

(51) Int. Cl.
*H05K 5/02* (2006.01)
*H05K 7/14* (2006.01)

(58) Field of Classification Search
CPC ..... E05B 2047/0094; E05B 2047/0095; E05B 47/06; E05B 47/0657; E05B 47/0665; E05B 47/0669; E05B 81/16; E05B 81/28; E05B 81/42; E05B 85/26; E05B 41/00; E05B 47/023; E05B 2047/0058; E05B 2047/0067; E05B 2047/0071; E05C 3/16; E05C 3/24; E05C 3/12; E05C 3/162; E05C 3/165; E05C 3/22; E05C 3/26; E05C 3/30; E05C 3/38; E05C 3/40; H05K 5/0221; H05K 7/1485; H05K 7/1409; H05K 7/1489; G06F 21/86; G07C 9/0069; G07C 9/00698
See application file for complete search history.

(56) References Cited

U.S. PATENT DOCUMENTS

| | | | |
|---|---|---|---|
| 6,321,335 B1* | 11/2001 | Chu | G06F 21/34 726/28 |
| 6,685,489 B1* | 2/2004 | Rubenstein | H01R 12/7005 439/157 |
| 8,151,610 B2* | 4/2012 | Fujihara | E05B 77/28 292/201 |
| 9,355,278 B2* | 5/2016 | Sankar | G06F 21/86 |
| 11,136,792 B2* | 10/2021 | Jeong | E05B 77/30 |
| 11,537,160 B2* | 12/2022 | Tan | E05B 65/006 |
| 2003/0214384 A1* | 11/2003 | Milo | E05B 47/0012 340/5.7 |
| 2005/0111178 A1* | 5/2005 | Bradley | H05K 7/1411 360/99.06 |
| 2016/0032629 A1* | 2/2016 | Rahilly | E05C 3/12 292/197 |
| 2018/0030759 A1* | 2/2018 | Chanbonpin | E05B 65/0007 |

* cited by examiner

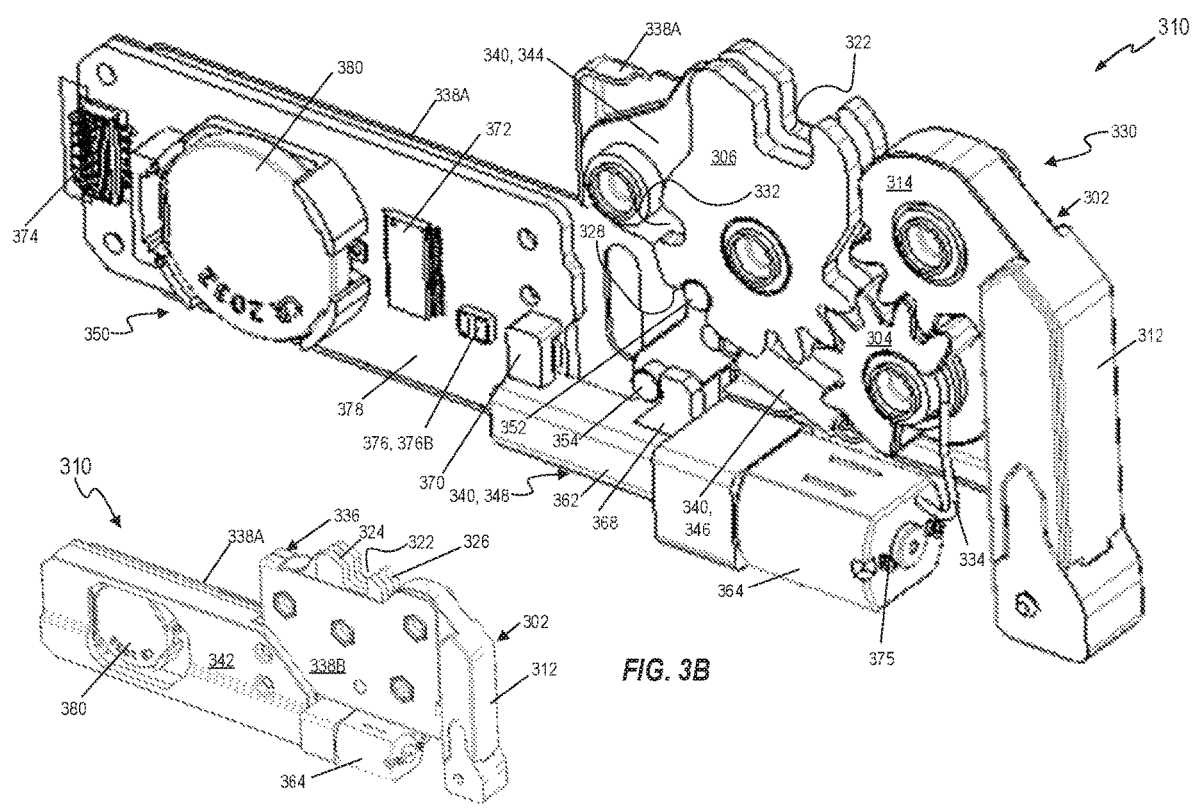

SECURITY SYSTEM HAVING AN ELECTRONIC LOCK TO CONTROL ACCESS TO ELECTRONIC DEVICES

BACKGROUND

Electronic devices, such as rack mount devices and blade devices process and store customer data including sensitive and/or confidential information. Because of the risk of fraud and security breaches, great importance is placed on securing data from tampering and/or preventing access to discrete components of an integrated circuit of electronic devices. For example, the Federal Information Processing Standard (FIPS) Publication 140-2 is a U.S. government computer security standard designed to coordinate the requirements and standards for cryptography modules that include both hardware and software components.

BRIEF DESCRIPTION OF THE DRAWINGS

Various examples will be described below with reference to the following figures.

FIG. 3B illustrates an assembled view of the electronic lock of FIG. 3A, according to one example of the present disclosure.

FIG. 3C illustrates the assembled view of the electronic lock of FIG. 3B having a housing, according to one example of the present disclosure.

DETAILED DESCRIPTION

Figure 1:
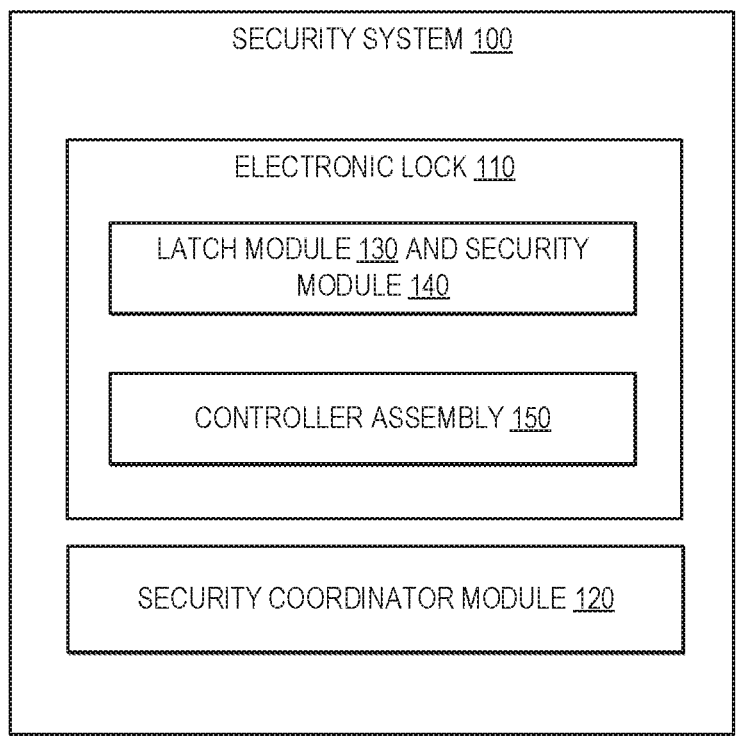
FIG. 1 illustrates a block diagram of a security system having an electronic lock to control access to an electronic device, according to one example of the present disclosure.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

As used herein, the term "unlatched configuration" refers to an open configuration of a latch module, where an anchor point of an object is not coupled to the latch module. Similarly, the term "latched configuration" refers to a closed configuration of the latch module, where the anchor point of the object is fastened to the latch module. In some examples, the object may be an enclosure or a rack of a data center and the anchor point may be fixedly coupled to the object. As used herein, the term "lock-in position" refers to a condition, where the latch module is prevented from rotating from the latched configuration to the unlatched configuration so as to secure the object fastened to the latch module. Similarly, the term "lock-out position" refers to a condition, where the latch module is prevented from rotating from the unlatched configuration to the latched configuration.

The present disclosure describes example implementations of a security system to control access to a plurality of electronic devices, such as rack mount devices and blade devices that are installed in a data center. In some examples, the blade devices may include a compute node, a storage node, and the like. Similarly, the rack mount devices may include a rack server, a just a bunch of drive (JBOD) device, or an input output (IO) device, and the like. In some examples, the security system may include an electronic lock having a latch module and a security module, and/or a controller assembly. The latch module fastens the electronic device in a latched configuration and the security module holds the electronic device in a lock-in position when the latch module is held in the latched configuration to prevent an unauthorized access to the electronic device. In some example, the control assembly controls an access request to the electronic device. In one or more examples, the electronic lock is held in the lock-in position after latching the electronic device to a rack or an enclosure of the datacenter. In such examples, when a user wants to access the electronic device, then the user may have to provide access credentials to the control assembly to access the electronic device in the data center.

In some examples, each of the plurality of electronic devices may include a management controller, such as baseboard management controller (BMC) communicatively coupled to a management system. In such examples, the user may interact with a corresponding electronic device via the management system to provide the access credentials to access the corresponding electronic device. In some other examples, each of the plurality of electronic devices may include a user interface unit to provide the access credentials to access the corresponding electronic device. In such examples, the user may directly interact with the corresponding electronic device via the user interface unit to provide the access credentials to access the corresponding electronic device. In all such examples, the management controller is communicatively coupled to the controller assembly of the electronic lock. The controller assembly may receive the access credentials provided by the user, and verify the received credentials before allowing the user to access the electronic device. In some examples, if the controller assembly determines that the user has provided the valid credentials, then the controller assembly may send signals to the electronic lock to release the security module from the lock-in position, thus allowing the user to access the corresponding electronic device.

Additionally, the security system may include a security coordinator module communicatively coupled to the electronic device via the management controller to monitor an access state of the electronic device and trigger a security operation in response to detection of an unauthorized access to the electronic device. In some examples, the unauthorized access to the electronic device may include tampering with the electronic device, a physical or electrical intrusion, software or firmware attack, unauthorized data and component access, physical removal or attempted removal, a malicious attack, security breach, or any other security compromise to the electronic device.

For purposes of explanation, certain examples are described with reference to the devices illustrated in FIGS. 1-6. The functionality of the illustrated devices may overlap, however, and may be present in a fewer or greater number of elements and devices. Further, all or part of the functionality of illustrated elements may co-exist or be distributed among several geographically dispersed locations. Moreover, the disclosed examples may be implemented in various environments and are not limited to the illustrated examples. Further, the sequence of operations described in connection with FIGS. 4A-4E and 6A-6C are an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

Customer data security needs are increasing and access control (i.e., physical and electronic) to such electronic devices is a critical component of security. There are differing levels of security within the FIPS requirement that require an ever increasing amount of security and protection of data and cryptographic keys (i.e., string of bits used by a cryptographic algorithm to transform plain text into cipher text or vice versa). For example, FIPS 140-2 defines four levels of security, in which level 1 provides the lowest level of security and level 4 provides the highest level of security. The security standards include requirements that prevent unauthorized users from viewing, tampering, or damaging internal components (including data) of electronic devices. FIPS (e.g., level 2) specifies enhanced security mechanism for a cryptographic module by requiring tamper evidence (e.g., tamper-evident coatings or seals, pick-resistant locks) which must be broken to attain physical access to the plain text cryptographic keys and critical security parameters within the module or electronic device, and a tamper-evident enclosure that is visually opaque.

Accordingly, it is desirable to have an electronic lock for restricting physical access to the individual electronic devices and implement access control solutions for such individual electronic device in a network of electronic devices, as well as manage and control access to the network of electronic devices. For example, it would be beneficial to implement an access control solution for each electronic device in a rack or an enclosure, and to manage and control access on the datacenter level by interfacing with a datacenter management system.

In some examples, the electronic lock may include a latch module to latch the electronic device to a rack or an enclosure, and unlatch the electronic device from the rack or the enclosure. Additionally, the electronic lock may include a security module to secure the electronic device in the latched configuration, thereby preventing unauthorized access/removal of the electronic device from the rack or the enclosure.

In some examples, when the latch module is in the unlatched configuration, the latch module may be held in a lock-out position to prevent from accidental transitioning of the latch module from the unlatched configuration to the latched configuration. However, the latch module may be moved from the unlatched configuration to the latched configuration, after the latch module is released from the lock-out position. Further, when the latch module is in latched configuration i.e., by way of coupling the electronic device to the rack or the enclosure, the security module may be held in a lock-in position to prevent unauthorized access to the electronic device. In other words, when the security module is in the lock-in position, the latch module cannot be transitioned from the latched configuration to the unlatched configuration. Only after the security module is released from the lock-in position, the latch module may be transitioned from the latched configuration to the unlatched configuration, thereby allowing the electronic device to be decoupled/detached from the rack or the enclosure.

Examples described herein provide solutions for managing and controlling access to electronic devices and cryptographic keys thereon, recording access events and monitoring software status, data fabric status, and machine state of electronic devices to detect, alert and respond to security threats. In one example, a security system to control access to an electronic device includes an electronic lock having a controller assembly, and a security coordinator module coupled to the controller assembly. The controller assembly is to receive access request to the electronic device, and based on the user credentials the controller assembly may move the security module to a lock-in position or release the security module from the lock-in position. The security coordinator module is to monitor an access state of the electronic device and trigger a security operation in response to detection of an unauthorized access to the electronic device.

In some examples, the electronic lock include a latch module and a security module. The latch module includes a receiver, a torque member, and a handle. The receiver includes a first recess, a second recess, and a lobe to releasably engage an anchor point within the first recess. The torque member is rotatably coupled to the receiver and the handle. The security module includes a lock member, a tension spring, and an actuator. The lock member includes a first pin and a second pin. The tension spring is coupled to the lock member to engage the first pin to the second recess when the latch module is in a latched configuration, and hold the security module in a lock-in position. The actuator engaged to the second pin for rotating the lock member and release the security module from the lock-in position.

In some examples, the controller assembly is coupled to the actuator of the electronic lock so as to control the security module to move to the lock-in position or release from the lock-in position. In some examples, when the actuator receives a signal from the controller assembly to release the security module from the lock-in positon, the actuator may apply a linear force on the lock member in a first direction when the latch module is in the latched configuration to disengage the first pin from the second recess so as to release the security module from the lock-in position. Similarly, when the actuator receives the signal from the controller assembly to retain the security module in the lock-in position, the actuator may retract the linear force in a second direction opposite to the first direction when the latch module is in the latched configuration to engage the first pin to the second recess to hold the security module in the lock-in position.

The security coordinator module may monitor and record access to the electronic device, and detect an unauthorized access to the electronic device. In response to detecting an unauthorized access to the electronic device, the security coordinator module may initiate a security operation to prevent access to components or cryptographic keys of the electronic device. The security operation may include activating a cryptographic zeroisation, initiating a surveillance system, or triggering an alarm.

Referring now to the figures, FIG. 1 is a block diagram of a security system 100 to control access to an electronic device, in accordance to one example of the present disclosure. The security system 100 may be useful for controlling access to an electronic device. According to various implementations, the security system 100 and the various components described herein may be implemented in hardware and/or a combination of hardware and programming that configures hardware. In various implementations, the security system 100 may be implemented in the electronic device, a management system separate from the electronic device, or may be implemented on a combination of the electronic device and the management system. Furthermore, in FIG. 1 and other figures described herein, different number of components or entities than depicted may be used.

The security system 100 may include an electronic lock 110 and a security coordinator module 120. The electronic lock 110 includes a latch module 130, a security module 140, and a controller assembly 150. Each of the components 110 and 120 may include combination of hardware and programming that performs a designated function. For example, the hardware may include one or both of a processing resource and a machine-readable medium, while the programming includes instructions or code stored on the machine-readable medium and executable by the processing resource to perform the designated function. A processing resource may be a microcontroller, a microprocessor, central processing unit (CPU) core(s), application-specific integrated circuit (ASIC), a field programmable gate array (FPGA) and/or other hardware device suitable for retrieval and/or execution of instructions from the machine-readable medium, and the machine-readable medium may be random access memory (RAM), read-only memory (ROM), electrically erasable programmable read-only memory (EEPROM), flash memory, a hard disk drive, etc.

The electronic lock 110 is associated with the electronic device, and may be actuated (i.e., activated or inactivated), based on signal (i.e., command or instruction) received from the controller assembly 150. Thus, the electronic lock 110 may be moved to a lock-in position or released from the lock-in position, to allow access or deny access, respectively, to the electronic device. Accordingly, the electronic lock 110 may be electrically actuated to restrict or prevent access to the electronic device, based on authorization parameters. In some examples, the electronic lock 110 may include a physical locking mechanism, such as the latch module 130 and the security module 140 to prevent access (e.g., opening, removal, sliding, propping, etc.) of the electronic device or its components. The structure of the physical locking mechanism of the electronic lock 110 and the method of switching positions (i.e., move to the lock-in position or release from the lock-in position) of the electronic lock 110 is described in greater details below.

In some example implementations, a location of the electronic lock 110 may be determined based on a desired location of the cryptographic boundary for the electronic device. In other words, the location of the electronic lock 110 is based on a circuitry, component, data, cryptographic key, module, etc. of the electronic device to be protected. In one example, where the electronic device is a rack mount device (e.g., rack mount servers, rack mount storage devices, rack mount storage devices, rack mount switches, rack mount power supply units (PSUs), rack mount power distribution units (PDUs), etc.), the electronic lock 110 may be located on the slide/rail mount in the rack, the hood of the rack mount device, or on an internal enclosure of the rack mount device. In another example, where the electronic device is a blade device (e.g., blade server, blade storage, blade switch, fabric attached memory, etc.), the electronic lock 110 may be located on a hood of the blade device or internal enclosure of the blade device.

The controller assembly 150 may be located internal to the electronic device. Accordingly, the controller assembly 150 may be located inside the defined cryptographic boundary, as desired. In some examples, the controller assembly 150 may include a printed circuit board (PCB), signal and power interfaces, a pair of sensors, and an onboard backup power source (not shown in FIG. 1). In some examples, the controller assembly 150 may be communicatively coupled to a baseboard management controller (BMC) of each electronic device. The controller assembly 150 may be electrically and communicatively coupled to the latch and security modules 130, 140 and other components of the electronic device via an inter-integrated circuit (I2C) bus, for example.

The controller assembly 150 may receive access request to the electronic device and control the latch and security modules 130, 140 to move to the lock-in position or release from the lock-in position. For example, the controller assembly 150 may receive a user request, via a user interface unit or a management system (not shown in FIG. 1), to access the electronic device. In some example, each electronic device may have the user interface unit communicatively coupled to the controller assembly 150. In some other examples, the management system is communicatively coupled to the controller assembly 150 via a management controller (not shown in FIG. 1). In response to the access request, the controller assembly 150 may validate and/or authenticate the access request by verifying that the user is authorized to access the electronic device. In some examples, verification may be done by comparing the user access request to a database of authorized users, where the database or storage device storing the list of authorized user may be internal to or external to the controller assembly 150. The controller assembly 150 may determine when to activate or deactivate the and the latch and security modules 130, 140 of the electronic lock 110 based on whether or not the user is authorized to access the electronic device.

The security coordinator module 120 is communicatively coupled to the controller assembly 150 via the management controller and may monitor an access state of the electronic device and trigger a security operation in response to detection of an unauthorized access to the electronic device. As used herein, an unauthorized access to the electronic device includes tampering with the electronic device, a physical or electrical intrusion, software or firmware attack, unauthorized data and component access, physical removal or attempted removal, a malicious attack, security breach, or any other security compromise to the electronic device. Monitoring an access state of the electronic device includes determining whether the electronic device is locked/unlocked, forced/tampered, removed, online/offline, and other machine states to detect, alert, and respond to security threats. Triggering a security operation in response to detection of an unauthorized access to the electronic device includes triggering a security alarm, initiating surveillance, or executing a cryptographic zeroisation. As used herein a cryptographic zeroisation means erasing sensitive parameters (i.e., electronically stored data, cryptographic keys, critical security parameter, etc.) from a cryptographic module to prevent their disclosure.

The security coordinator module 120 may manage a plurality of electronic devices via a corresponding controller assembly 150 and a corresponding management controller of each of the plurality of electronic devices. Thus, the security coordinator 120 may monitor the access states and trigger security operations for each electronic device. In certain implementations, the security coordinator module 120 may be external to the electronic devices and reside on the rack which houses the electronic devices. In such an implementation, for example, the security coordinator module 120 may be a top of rack (ToR) device that aggregates control functionality for each electronic device in the rack, and serves as a security manager between a management system (e.g., a datacenter management system) and the electronic devices. Thus, in this example, the controller assembly 150 may be coupled to or interface with the security coordinator module 120 via a network infrastructure (e.g., an optical, electrical, or wireless connection). In other implementations, the security coordinator module 120 may be internal to an electronic device (e.g., a master device), which may serve as an aggregator for other electronic devices that are managed. For example, the security coordinator module 120 may reside on an onboard administrator of the enclosure of the electronic device, and reside in one of the 'U' locations of the rack (as compared to ToR).

In various examples, the security coordinator module 120, in addition to managing access to the electronic devices, may monitor software status, data fabric status, cryptographic keys, and machine state to detect, alert, and respond to security threats, as described herein. The security coordinator module 120 may also push firmware updates and user access rights to the respective management controller and/or the controller assembly 150 of the electronic devices.

In performing their respective functions, the electronic lock 110, the security coordinator 120, and the controller assembly 150 may access a data storage and/or other suitable database(s) (not shown). Data storage and/or database may represent any memory accessible to the security system 100 that may be used to store and retrieve data, and may comprise RAM, ROM, EEPROM, cache memory, floppy disks, hard disks, optical disks, tapes, solid state drives, flash drives, portable compact disks, and/or other storage media for storing computer-executable instructions and/or data. The security system 100 may access data storage locally or remotely via a network.

Figure 2:
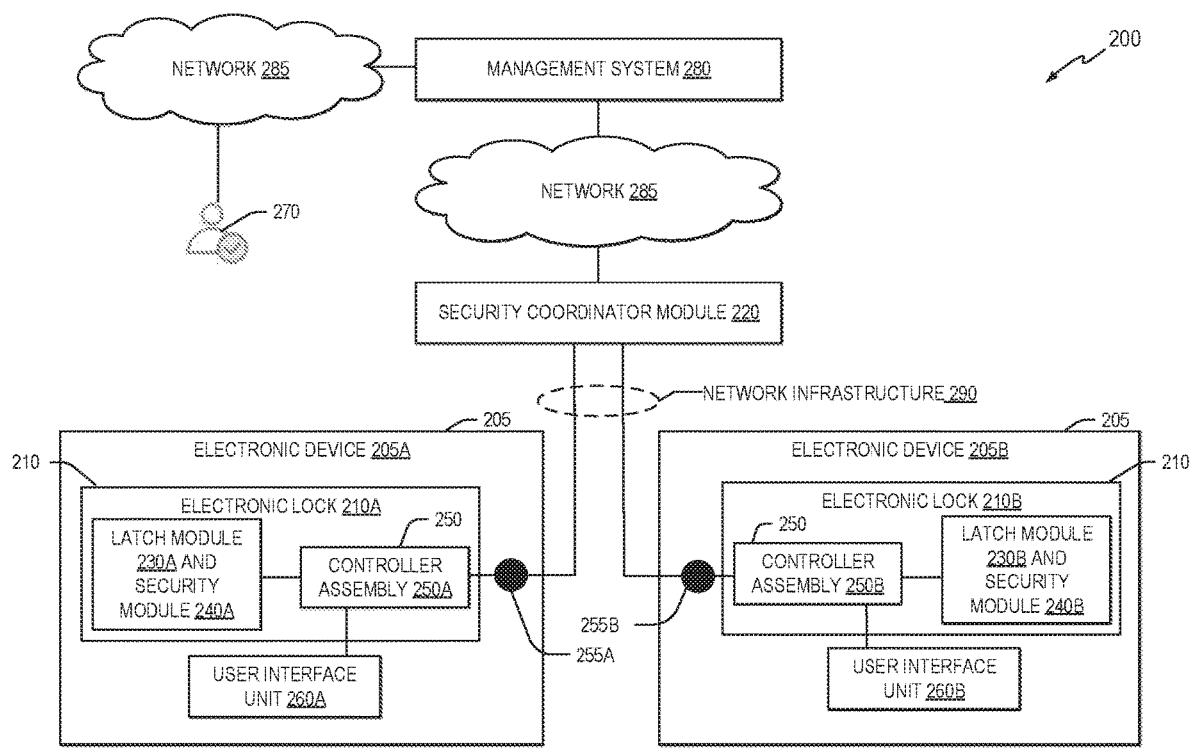
FIG. 2 illustrates a block diagram of a security system having an electronic lock to control access to an electronic device, according to another example of the present disclosure.

FIG. 2 is a block diagram of a security system 200 to control access to each of a plurality of electronic devices 205A, 205B using a plurality of electronic lock 210A, 210B, one lock for each electronic device. In some examples, electronic devices 205A and 205B may include substantially similar components. For example, the electronic device 205A may include an electronic lock 210A, a management controller 255A, and a user interface unit 260A. Similarly, the electronic device 205B may include an electronic lock 210B, a management controller 255B, and a user interface unit 260B. In some examples, the management controllers 255A and 255B may be baseboard management controllers (BMC). The electronic lock 210A may include a latch module 230A, a security module 240A, and a controller assembly 250A. Similarly, the electronic lock 210B may include a latch module 230B, a security module 240B, and a controller assembly 250B. As discussed hereinabove, the electronic devices 205A and 205B may be rack mount devices (e.g., servers, storage devices, networking devices, PDUs, PSUs, switches, etc.) or blade devices (e.g., servers, storage devices, networking devices, switches, etc.). Further electronic devices 205A and 205B may reside on the same rack or on different racks within a data center or enclosures, for example.

The electronic locks 210A and 210B may be activated to prevent physical access to the electronic devices 205A and 205B, respectively, including preventing physical access to components, data, or cryptographic keys therein. The movement or position of the security modules 240A and 240B of the electronic locks 210A and 210B respectively may be controlled by respective controller assemblies 250A and 250B, based on an authorization process. The physical structure of the locking mechanism of the electronic locks 210A and 210B and the method of switching the positions (i.e., hold in a lock-in position and release from the lock-in position) of the electronic locks 210A and 210B are described in greater details below.

In some examples, the controller assemblies 250A and 250B may receive a user access request via respective user interface units 260A and 260B of the electronic devices 205A and 205B. For example, the user interface units 260A and 260B may include a biometric scanner, a radio frequency identification (RFID), a passcode keypad, a contactless tag reader (e.g., near field communication (NFC) tag reader), an access request button, etc. Thus, the user access request is received by the controller assemblies 250A and 250B via the user interface units 260A and 260B of the electronic devices 205A and 205B. In some other examples, the controller assemblies 250A and 250B may receive a user access request 270 via a management system 280 and the management controllers 255A and 255B, and that is communicatively coupled to the electronic devices 205A and 205B over a network 285. For example, the management system 280 may provide a user interface for the user to enter access credentials to access the electronic devices 205A and 205B.

In response to the user access request, the controller assemblies 250A and 250B may determine whether to allow access or deny access to the electronic devices 205A and 205B, for example, by verifying whether the user is authorized. Authorization may be verified by accessing a database or storage medium that includes authorized users.

The controller assemblies 250A and 250B of the electronic devices 205A and 205B are coupled to the security coordinator module 220 via a network infrastructure 290. The network infrastructure 290 may be a wired or wireless connection. For example, network infrastructure 290 may be an optical connector, an electrical connector, a wireless connector (e.g., local area network, Wi-Fi, wireless area network, etc.), or a combination thereof. The network infrastructure 290 enables the security coordinator 220 to communicate with the plurality of electronic devices 205A and 205B.

The security coordinator module 220 manages the security of the electronic devices 205A and 205B by managing and recording access events, monitoring and maintaining software status, data fabric status, cryptographic keys, and machine state to detect, alert, and respond to security threats. For example, the security coordinator module 220 may trigger a security operation in response to detection of an unauthorized access or security threat to the electronic devices 205A and 205B. A security operation may include sounding or signaling a security alarm, cryptographic zeroisation, or initiating a surveillance system. The security coordinator module 220 may be coupled to the management system 280 via the network 285.

The management system 280 may be a data center management system, for example, that manages the resources of the data center (e.g., servers, storage devices, networking devices, switches, etc.). The management system 280 may include an application programming interface (API) to interface with the security coordinator module 220. The management system 280 may communicate with the security coordinator module 220 over the network 285. In some examples, the network 285 may be any wireless network infrastructure. The management system 280 may receive access state information, software status, and network activity related to the electronic devices 205A and 205B, from the security coordinator module 220. The management system 280 may also transmit access keys (e.g., user access credentials), tamper response commands, shut down commands, and other management commands to the security coordinator module 220. Accordingly, the management system 280 may manage and communicate with a plurality of security coordinator modules 220. The management system 280 may allow an administrator to remotely manage a pool of resources (e.g., compute, storage, networking, etc.) in the data center.

Figure 3A:
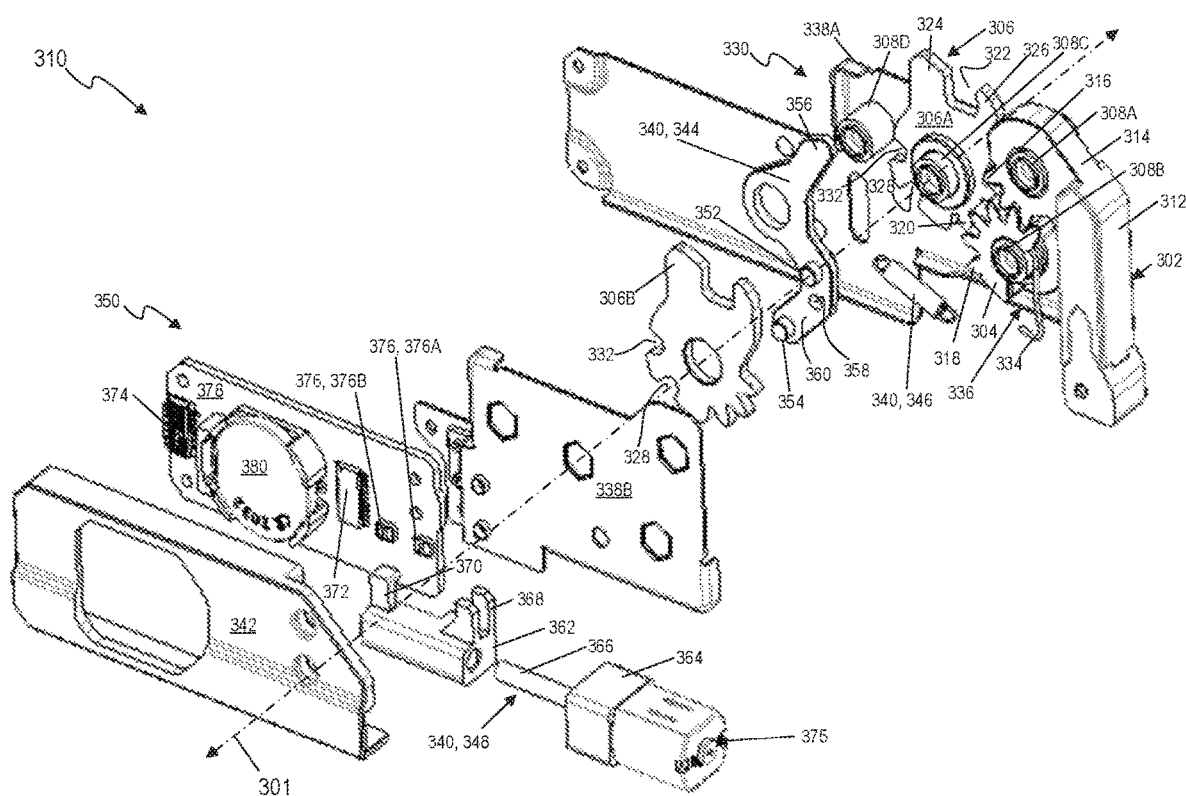
FIG. 3A illustrates an exploded view of an electronic lock, according to one example of the present disclosure.

FIG. 3A is an exploded view of an electronic lock 310, in accordance to one example of the present disclosure. FIG. 3B is an assembled view of the electronic lock 310 of FIG. 3A, in accordance to one example of the present disclosure. The electronic lock 310 is assembled relative to an axis 301 (as shown in FIG. 3A). FIG. 3C is the assembled view of the electronic lock 310 of FIG. 3B having a housing 336, in accordance to one example of the present disclosure.

As discussed hereinabove, the electronic lock 310 includes a latch module 330, a security module 340, and a controller assembly 350. In some examples, the security module 340 is electrically and communicatively coupled to the control assembly 350 and detectably engaged to the latch module 330. For example, the electronic lock 310 may fasten an electronic device 205 (as shown in FIG. 2) to an enclosure or a rack of a data center, in a latched configuration of the latch module 330, and the security module 340 may then lock the latch module 330 in the latched configuration (i.e., by moving the security module 340 to a lock-in position) to prevent an unauthorized access to the electronic device. In some examples, the security module 340 is electrically and communicatively coupled to the controller assembly 350 and may receive signals from the controller assembly 350 to move the security module 340 to the lock-in position to prevent unauthorized access to the electronic device or release the security module 340 from the lock-in position to allow the authorized access to the electronic device.

The latch module 330 includes three rotatable components: a handle 302, a torque member 304, and a receiver 306. These rotatable components are disposed on separate shafts 308A, 308B, and 308C respectively, allowing each of those components to rotate relative to the respective shafts. The shafts 308A, 308B, and 308C may be additionally used to fixedly secure the latch module 330 to the electronic device. Accordingly, the shafts 308A, 308B, and 308C may be hollow to allow a fastener such as a bolt, a screw, a rivet, or other fastener to pass through the respective shafts 308A, 308B, and 308C and may include a tapered crown to retain the fastener. The fastener may fixedly secure the latch module 330 to the electronic device. In some examples, the components 302, 304, 306 are coupled to the respective shaft 308A, 308B, 308C in such a manner as to allow the component 302, 304, 306 to rotate relative to its shaft 308A, 308B, 308C. Additionally or in the alternative, the components 302, 304, 306 may be fixedly coupled to the shaft 308A, 308B, 308C, and it is the respective shafts 308A, 308B, 308C itself that rotates in order to rotate the coupled components 302, 304, 306.

The handle 302 may include a lever portion 312 and a torque portion 314. The lever portion 312 may provide a working surface for an application of a rotational force on the latch module 330, and the torque portion 314 may include a plurality of first gears 316. The torque member 304 may include a plurality of second gears 318 that may be complementary to the plurality of first gears 316. In such examples, the plurality of second gears 318 may interface with the plurality of first gears 316. Additionally, the receiver 306 may include a plurality of third gears 320 that may be complementary to the plurality of second gears 318. In such examples, the plurality of third gears 320 may interface with the plurality of second gears 318.

The plurality of second gears 318 and the plurality of third gears 320 may be collectively referred to as a first pair of complementary gear features. In such examples, the torque member 304 is rotatably coupled to the receiver 306 by the first pair of complementary gear features. Similarly, the plurality of first gears 316 and the plurality of second gears 318 may be collectively referred to as a second pair of complementary gear features. In such examples, the torque portion 314 of the handle 302 is rotatably coupled to the torque member 304 by the second pair of complementary gear features. During operation, a rotational force may be applied on the lever portion 312 of the handle 302, and such rotational force applied on the lever portion 312 may be transferred to the receiver 306 via the torque portion 314 of the handle 302, and the torque member 304.

In some examples, the receiver 306 may include a first recess 322 formed between a first lobe 324 and a second lobe 326 of the receiver 306 for engaging an anchor point (not shown) of an object (i.e., second object), such as an enclosure or a rack of the data center, within the first recess 322. The receiver 306 may further include a second recess 328 disposed proximate to the plurality of third gears 320, and a third recess 332 disposed between the second recess 328 and the first lobe 324. In some examples, the first, second, and third recesses 322, 328, 332 may be formed along a perimeter of the receiver 306.

Figure 4A:
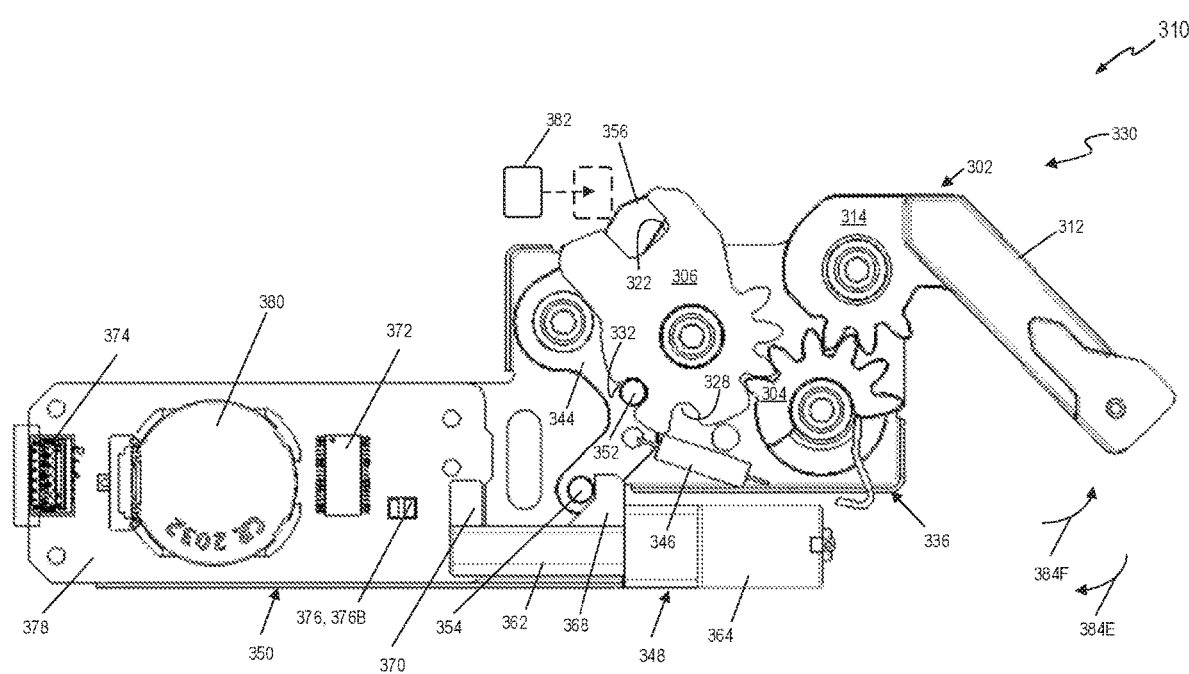
FIG. 4A illustrates a top view of the electronic lock of FIG. 3B having a latch module held in a lock-out position when the latch module is in an unlatched configuration, according to some examples of the present disclosure.
Figure 4B:
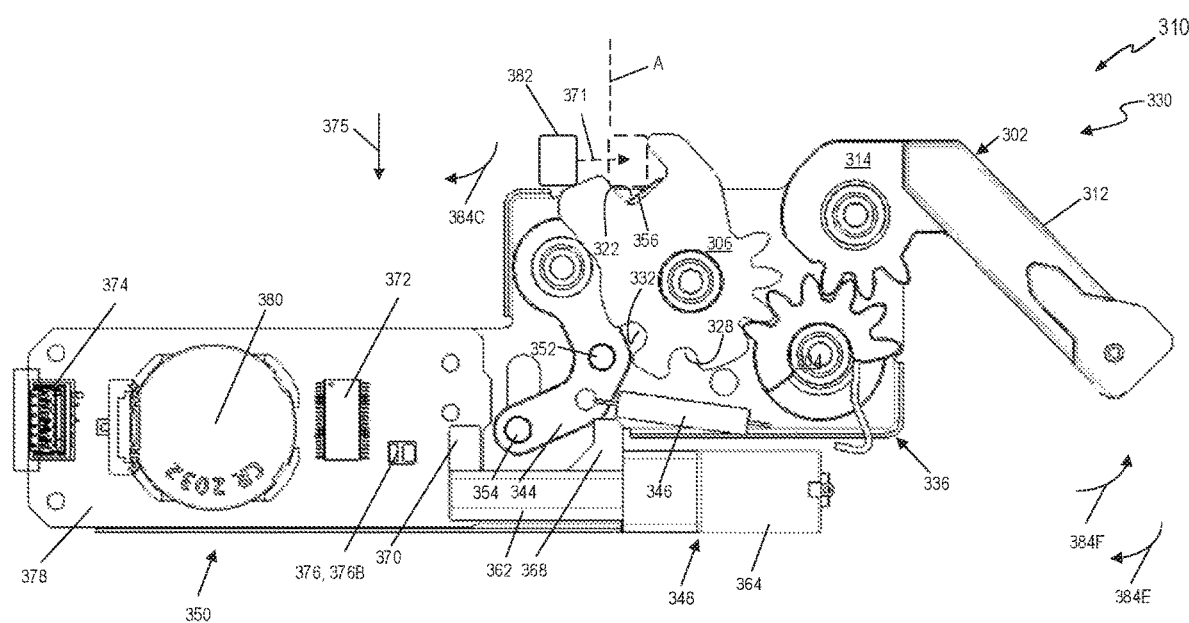
FIG. 4B illustrates a top view of the electronic lock of FIG. 3B having the latch module release from a lock-out position when the latch module is in an unlatched configuration, according to some examples of the present disclosure.

In some examples, the latch module 330 may further include a torsion spring 334 coupled to the torque member 304. The torsion spring 334 may be disposed within a recess (not shown) of the torque member 304 and apply a bias force (spring force) to the torque member 304 in order to bias the latch module 330 towards an unlatched configuration when not in a latched configuration and to extend the lever portion 312 of the handle 302 (as shown in FIG. 4B), when in the unlatched configuration. Accordingly, a first spring arm (not labeled) of the torsion spring 334 may be coupled to apply the bias force to the torque member 304, while a second spring arm (not labeled) of the torsion spring 334 may be coupled to apply a countervailing spring force to the housing 336. In the shown example, the receiver 306 is formed by two symmetrical pieces 306A, 306B, which are spaced apart from each other and coupled to the shaft 308C. It may be noted herein that the two symmetrical pieces 306A and 306B operates in tandem.

Each of the components, such as the handle 302, the torque member 304, the receiver 306, and the shafts 308A, 308B, 308C may include any suitable material(s) (e.g., metal, metal alloy, plastic, etc.) and may be formed using any suitable process. In some examples, the handle 302, the torque member 304, and the receiver 306 are formed of machined sheet metal such as cold rolled steel, hot rolled steel, stainless steel, aluminum, alloys thereof, and/or other sheet metal stock. In some examples, the handle 302, the torque member 304, and the receiver 306 are formed of cast metal and/or metal alloy such as aluminum, magnesium, copper, tin, zinc, iron, steel, other metals, and/or alloys thereof.

The security module 340 includes a rotatable lock member 344, a tension spring 346, and an actuator 348. The lock member 344 is disposed on a separate shaft 308D that allows the lock member 344 to rotate. Accordingly, the shaft 308D may be hollow to allow a fastener, such as a bolt, screw, the rivet, or other fastener to pass through the shaft 308D and may include the tapered crown to retain the fastener. The fastener may fixedly secure the lock member 344 to the electronic device. In one example, the lock member 344 is coupled to the shaft 308D in such a manner as to allow the lock member 344 to rotate relative to the shaft 308D. In another example, the lock member 344 is fixedly coupled to the shaft 308D, and it is the shaft 308D itself that rotates in order to rotate the lock member 344. In some examples, the lock member 344 has "S" shaped profile. The lock member 344 includes a first pin 352, a second pin 354, a release lobe 356, and an opening 358. In some examples, the second pin 354 and the release lobe 356 are located at opposite ends of lock member 344. In such examples, the first pin 352 is located between the second pin 354 and the release lobe 356 and the opening 358 is located between the first and second pins 352, 354. In some examples, the first and second pins 352, 354 extend outwardly (i.e. protrude) from a surface 360 of the lock member 344.

The first pin 352 is configured to engage to the third recess 332 when the latch module 330 is in the unlatched configuration. The first pin 352 when engaged with the third recess 332 prevents the handle 302, the torque member 304, and the receiver 306 from rotating, and thereby prevent the latch module 330 from transitioning from the unlatched configuration to the latched configuration even though a force (as shown in FIG. 4A) is applied to the lever portion 312 of the handle 302. Thus, an operator/user may grasp and torque the lever portion 312 when aligning a first object containing the electronic lock 310 with a second object containing an anchor point without accidentally closing the latch module 330. In some examples, the first object may be an electronic device, for example, a compute node or a storage node, or other object. The second object may be the enclosure or the rack, or other object of the data center. In one or more examples, when the latch module 330 is in the unlatched configuration, the first pin 352 is engaged with the third recess 332 to hold the latch module 330 in a lock-out position (as shown in FIG. 4A), thus allowing the user to align the first object containing the electronic lock 310 with the second object containing the anchor point.

Figure 4C:
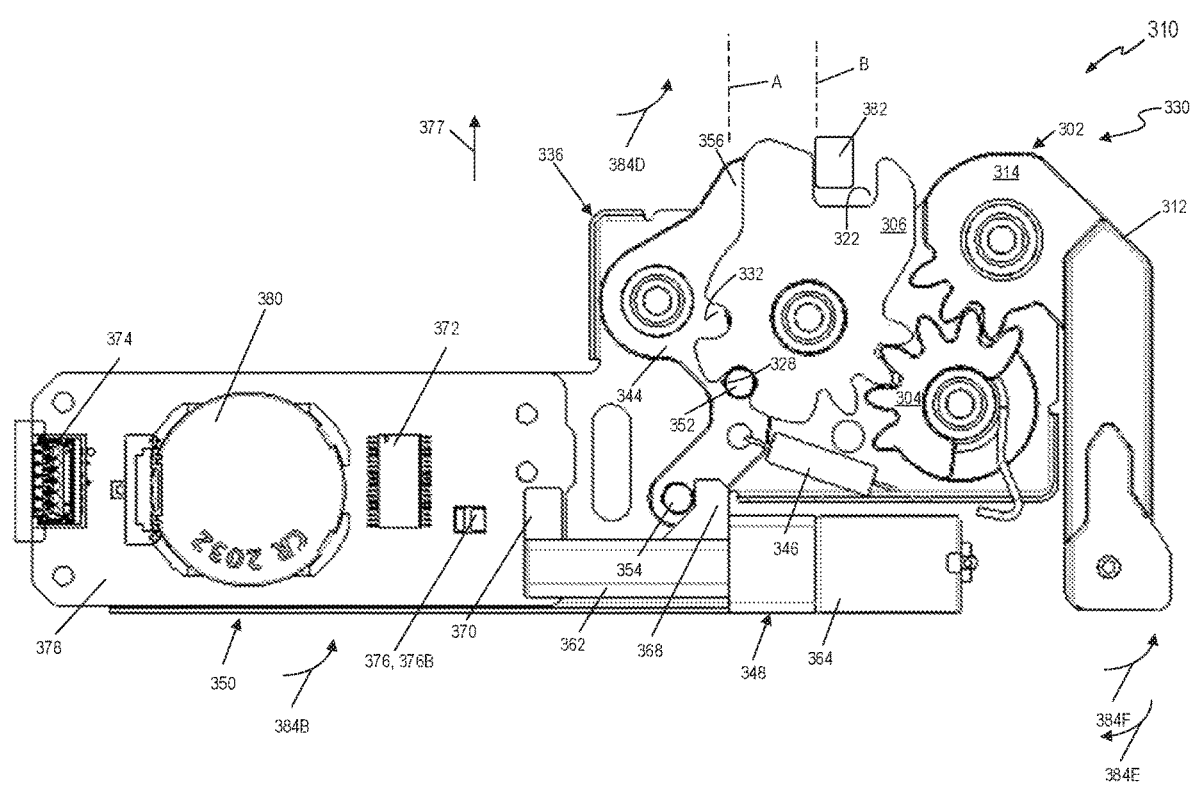
FIG. 4C illustrates a top view of the electronic lock of FIG. 3B having the security module held in a lock-in position when the latch module is in a latched configuration, according to some examples of the present disclosure.

The first pin 352 is further configured to engage to the second recess 328 of the receiver 306 when the latch module 330 is in the latched configuration. The first pin 352 when engaged with the second recess 328 may prevent the handle 302, the torque member 304, and the receiver 306 from rotating, and thereby prevent the latch module 330 from transitioning from the latched configuration to the unlatched configuration in response to the force (as shown in FIG. 4C) applied to the lever portion 312 of the handle. Thus, after the first object (with electronic device 310) is aligned with a second object (with the anchor point) and the latch module 330 is moved into a latched configuration, and the first pin 352 is engaged with the second recess 328 to hold the security module 340 in the lock-in position (as shown in FIG. 4C), the user/operator may not be able to remove the first object containing the electronic lock 310 from the second object without valid authorization.

The tension spring 346 may be attached to the housing 336 (as shown in FIGS. 3B and 3C) and the opening 358 of the lock member 344 in order to apply a biasing force on the lock member 344 to engage the first pin 352 in the second recess 328 when the latch module 330 is in the latched configuration, and hold the security module 340 in the lock-in position (as shown in FIG. 3B and FIG. 4C). This prevents the latch module 330 from transitioning from the latched configuration to the unlatched configuration even when the force (as shown in FIG. 4C) is applied to the lever portion 312 of the handle 302. Further, the tension spring 346 may apply the biasing force on the lock member 344 to engage the first pin 352 in the third recess 332 when the latch module 330 is in the unlatched configuration, and hold the latch module 330 in the lock-out position. This prevents the latch module 330 from transitioning from the unlatched configuration to the latched configuration even when the force (as shown in FIG. 4A) is applied to the lever portion 312 of the handle 302.

In one or more examples, the release lobe 356 may be in contact with the anchor point 382 (as shown in FIG. 4A) of the second object when the latch module 330 is in the unlatched configuration and the security module 340 is released from the lock-in position (as shown in FIG. 4A). Further, the motion of moving the anchor point 382 into the first recess 322 may push the lock member 344 to rotate along a direction 384C (as shown in FIG. 4B) when the latch module is in the unlatched configuration and in the lock-out position, to disengage the first pin 352 from the third recess 332, and thereby release the latch module 330 from the lock-out position.

The actuator 348 includes a sliding component 362 and a motor 364 having a shaft 366. The sliding component 362 is coupled to the shaft 366 of the motor 364. The sliding component 362 includes a sliding block 368 and a reflector 370. The sliding block 368 and reflector 370 are located at opposite ends of the sliding component 362. The sliding block 368 may detachably engage to the second pin 354 of the lock member 344. The motor 364 may slide the sliding component 362 such that the sliding block 368 pushes the second pin 354 to cause the lock member 344 to rotate when the latch module 330 is in the latched configuration to disengage the first pin 352 from the second recess 328, and thereby release the security module 340 from the lock-in position. This allows a user to remove a second object (with an anchor point) from the first object (with the electronic lock).

In one or more examples, the motor 364, for example, a micro gear motor is electrically and commutatively coupled to the controller assembly 350 and configured to be actuated based on the signals received from the controller assembly 350. The controller assembly 350 includes a controller 372, power and signal interfaces 374, a pair of sensors 376 including a first sensor 376A and a second sensor 376B, a printed circuit card 378, and an onboard power backup 380, for example, a battery. The controller 372 may be communicatively coupled to the management controller 255A, 255B (as shown in FIG. 2) via the power and signal interfaces 374. The controller 372 is further electrically and communicatively coupled to the actuator 348, for example, to the motor 364 via power and signal interfaces 374 of the controller assembly 350 and power and signal interfaces 375 of the motor 364. The pair of sensors 376 may receive the position information of the sliding component 362 by receiving reflections from the reflector 370. The pair of sensors 376 may then send the received position information to the controller 372. In some examples, the controller 372 may actuate the motor 364 based on a predefined timer clock set by the user, or based on the valid user credentials received from the user. During operation, the motor 364 may slide the sliding component 362 such that the reflector 370 moves from a first position aligned with the first sensor 376A, to a second position aligned with the second sensor 376B. During such movement of the sliding component 362, the sliding block 368 which is detachably engaged with the second pin 354 may rotate the lock member 344 to disengage the first pin 352 from the second recess 328, and release the security module 340 from the lock-in position.

Each of the components, such as the lock member 344, the tension spring 346, and the shaft 308D may include any suitable material(s) (e.g., metal, metal alloy, plastic, etc.) and may be formed using any suitable process. In some examples, the lock member 344 is formed of machined sheet metal such as cold rolled steel, hot rolled steel, stainless steel, aluminum, alloys thereof, and/or other sheet metal stock. In some examples, the lock member 344 is formed of cast metal and/or metal alloy such as aluminum, magnesium, copper, tin, zinc, iron, steel, other metals, and/or alloys thereof.

Further, the receiver 306, the torque member 304, the torque portion 314, the torsion spring 334, the torsion spring 344, the lock member 344, and the tension spring 346 may be contained within the housing 336. In some examples, the housing 336 includes two separate covers, a back cover 338A and a front cover 338B. Further, the housing 336 further includes a controller front cover 342. The back cover 338A and the front cover 338B may each include openings to accommodate and secure the shafts 308A, 308B, 308C, 308D as well as openings for alignment and other purposes.

The back cover 338A, the front cover 338B, and the controller front cover 342 may include any suitable material(s) (e.g., metal, metal alloy, cast metal, plastic, etc.) and may be formed using any suitable process. In some examples, the back cover 338A, the front cover 338B, the controller front cover 342 are formed of machined sheet metal such as cold rolled steel, hot rolled steel, stainless steel, aluminum, alloys thereof, and/or other sheet metal stock. In some examples, the back cover 338A, the front cover 338B, and the controller front cover 342 are formed of cast metal and/or metal alloy such as aluminum, magnesium, copper, tin, zinc, iron, steel, other metals, or alloys thereof.

In some examples, the electronic lock 310 including the latch module 330 (and by extension the receiver 306, the torque member 304, and the handle 302) and the security module 340 (and by extension the lock member 344, the tension spring 346) may be fixedly coupled to a first object (i.e., an electronic device, for example, a compute node or a storage node or other object) such that the back cover 338A is in contact with the first object. Later, the electronic lock 310, which is fixedly coupled to the electronic device is disposed in the enclosure or the rack to latch/fasten the electronic device to an anchor point 382 (as shown in FIG. 4A) of the enclosure or the rack using the latch module 330, and secure/lock the electronic device in the latched configuration using the security module 340. It may be noted herein that the term "fixedly coupled" means two components are non-detachably coupled to one another.

FIG. 3B shows the assembled view of the electronic lock 310, where the latch module 330 is in the latched configuration and the security module 340 is in the lock-in position. In the example of FIG. 3B, the printed circuit card 378, is coupled to the back cover 338A and the lock member 344, the torque portion 314, the torque member 304, and the receiver 306 are rotatably disposed in the back cover 338A. Further, the handle portion 312 and the torque portion 314 of the handle 302 are movably coupled to one another. The torque portion 314 is rotatably coupled to the torque member 304. The receiver 306 is rotatably coupled to the torque member 304. The torsion spring 334 is coupled to the torque member 304 and the motor 364. The lock member 344 is detachably engaged to the receiver 306. In particular, the first pin 352 is engaged to the second recess 328. The tension spring 346 is coupled to the lock member 344 to apply the biasing force to engage the first pin 352 in the second recess 328. The sliding component 364 is coupled to the shaft 366 (as shown in FIG. 3A) of the motor 364. The sliding block 368 is releasably engaged to the second pin 354. The reflector 370 is located aligning to the first sensor 376A (as shown in FIG. 3A).

FIG. 3C shows the electronic lock 310 having the housing 336 covering substantially all components of the electronic lock 310 other then the onboard power backup 380, for example, a battery, the motor 364, the lever portion 312 of the handle 302, the first and second lobes 324, 326, the first recess 322, and the release lobe 356 of the lock member 344. Further, the controller front cover 342 is disposed over the controller assembly 350 such that the sliding component 364 is located on a bottom section of the controller front cover 342 and coupled to the back cover 338A. The sliding component 364 is configured to slide over the bottom section of the controller front cover 342. The controller front housing section 342 is disposed over the latch module 330 and the security module 340 and coupled to the back cover 338A.

FIGS. 4A, 4B, 4C, 4D, and 4E show a top view of the electronic lock 310 of FIG. 3B in different configurations and positions, in accordance to some examples of the present disclosure. As discussed hereinabove in the example of FIG. 3B, the electronic lock 310 includes the latch module 330, the security module 340, and the controller assembly 350.

In the example of FIG. 4A, the latch module 330 is in an unlatched configuration, where the handle 302 has been moved along a sixth direction 384F, which is away from the housing 336 and is in the position as shown in FIG. 4A. When the latch module 330 is in the unlatched configuration, the first pin 352 is engaged to the third recess 332 and the tension spring 346 may apply a biasing force on the lock member 344 to retain the first pin 352 in the third recess 332, and hold the latch module 330 in a lock-out position. Thus, the tension spring 346 retaining the first pin 352 in the third recess 332 may prevent the handle 302, the torque member 304, and the receiver 306 from rotating along a fifth direction 384E, and prevents the latch module 330 from transitioning from the unlatched configuration to the latched configuration even when a force applied to the lever portion 312 of the handle 302 along the fifth direction 384E. Thus, an operator/user may grasp and torque the lever portion 312 when aligning a first object containing the electronic lock 310 with a second object containing the anchor point 382 without accidentally moving the latch module 330. The anchor point 382 of the second object may then be introduced within the first recess 322 of the receiver 306 such that the anchor point 382 is in contact with the release lobe 356.

In the example of FIG. 4B, the latch module 330 is still in the unlatched configuration. In FIG. 4B, the first lobe 324 is titled downwards to allow an introduction of the anchor point 382 within the first recess 322 of the receiver 302, as shown by dotted line 371 till the anchor point 382 reaches a first position "A". Thus, the introduction of the anchor point 382 within the first recess 322 causes the release lobe 356 to move downwards within the first recess 322, as shown by a dotted line 375, while the release lobe 356 is still in connect with the anchor point 382. This results in rotating the lock member 344 along a third direction 384C. The rotation of the lock member 344 along the third direction 384C results in disengaging the first pin 352 from the third recess 332, and releases the latch module 330 from the lock-out position. The rotation of the lock member 344 further results in disengaging the second pin 354 from the sliding block 368 and applying a counter biasing force on the tension spring 346.

In the example of FIG. 4C, the latch module 330 is in the latched configuration. In FIG. 4C, the anchor point 382 is coupled within the first recess 322 of the receiver 302 when the latch module 330 is transitioned from the unlatched configuration (as shown in FIGS. 4A and 4B) to the latched configuration. In some examples, the latch module 330 may be transitioned to the latched configuration by rotating the handle 302 along a fifth direction 384E opposite to the sixth direction 384F. In other words, when the latch module 330 is transitioned from the unlatched configuration to the latched configuration, the first lobe 324 of the receiver 306 may engage with the anchor point 382 and move the anchor point 382 from the first position "A" to a second position "B" to couple the anchor point within the first recess 322. Thus, the receiver 302 may couple the first object containing the latch module 330 to the second object containing the anchor point 382. It may be noted herein that the handle 302 is free or able to rotate along the fifth direction 384E when the latch module 330 is released from the lock-out position. Thus, rotating the handle 302 along the fifth direction 384E rotates the receiver 306 via the torque member 304 to engage the anchor point 382 within the first recess 322, and move the latch module 330 to the latched configuration.

The transition of the latch module 330 from the unlatched configuration to the latched configuration may cause the release lobe 356 to move upwards as shown by a dotted line 377. The upward movement of the release love 356 is due to disconnect of the release lobe 356 from the anchor point 382, when the first lobe 324 moves the anchor point 382 from the first position "A" to the second position "B", thus allowing the lock member 344 to rotate along a fourth direction 384D. In such examples, the tension spring 346 may apply the biasing force on the lock member 344 to cause the lock member 344 to rotate along a second direction 384B or the fourth direction 384D to engage the first pin 352 to the second recess 328, and hold the security module 340 in the lock-in position, thereby restricting the latch module 330 from moving to the unlatched configuration (from a latched configuration) for securing/locking the electronic device to the enclosure or the rack of the data center. In some examples, the application of the biasing force along the second direction 384B by the tension spring 346 on the lock member 344 may cause the second pin 354 to re-engage with the sliding block 368.

The first pin 352 engaged with the second recess 328 may prevent the handle 302, the torque member 304, and the receiver 306 from rotating, and thereby prevent the latch module 330 from transitioning from the latched configuration to the unlatched configuration even when a force applied to the lever portion 312 of the handle. Thus, the user/operator may not be able to remove the first object containing the electronic lock 310 from the second object without valid authorization.

Figure 4D:
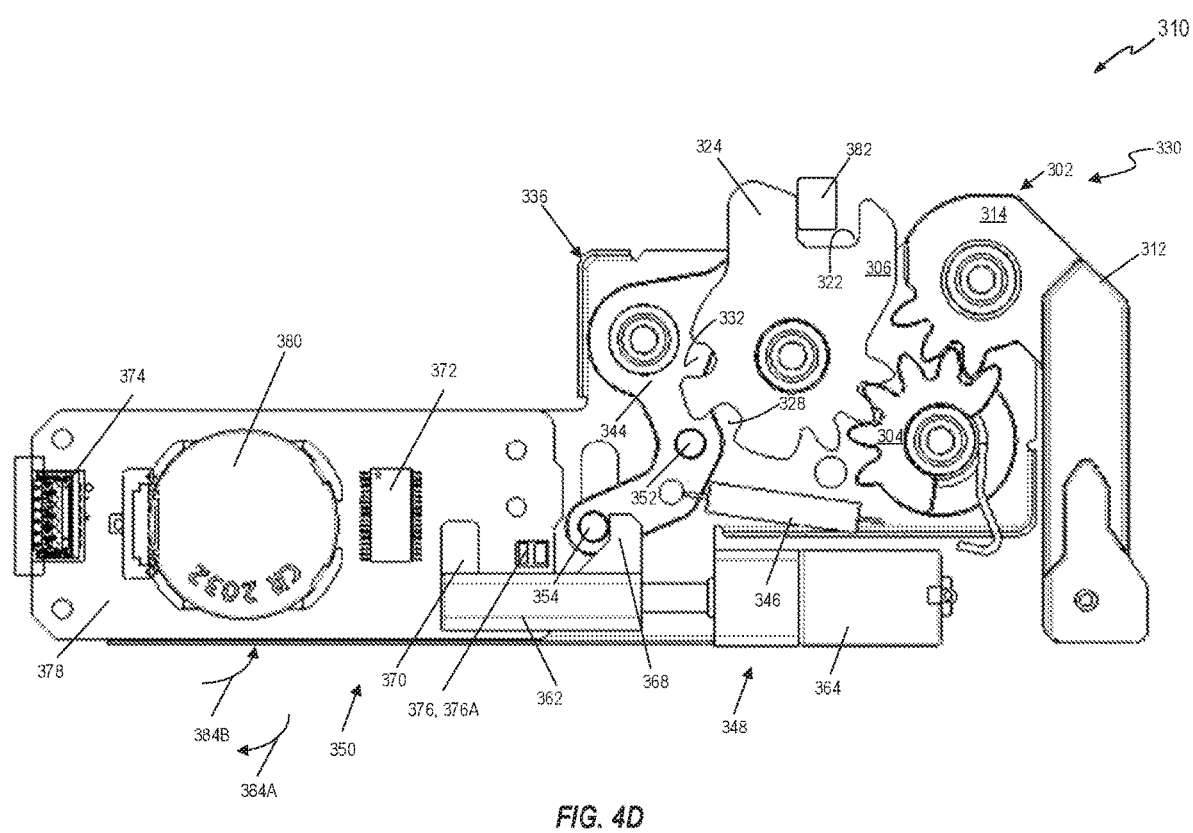
FIG. 4D illustrates a top view of the electronic lock of FIG. 3B having the security module released from a lock-in position when the latch module is in a latched configuration, according to some examples of the present disclosure.

In the example of FIG. 4D, the latch module 330 is in the latched configuration. As discussed in the example of FIGS. 1 and 2, when the user provides valid user credentials to access the electronic device, the controller assembly 350, for example, the controller 372 may send a signal to the actuator 348, for example, the motor 364 to release the security module 340 from the lock-in position. Thus, allowing the user to access the electronic device. In some examples, the signal may be in response to validating the user credentials received from the controller assembly 350 to access the electronic device. In such examples, the motor 364 may apply a rotational force to move the sliding component 362. When the sliding component 362 slides, the sliding block 368 may push the second pin 354, which may cause the lock member 344 to rotate along a first direction 384A opposite to the second direction 384B, to disengage the first pin 352 from the second recess 328. In particular, the application of the rotational force on the lock member 344 also generates a counter biasing force on the tension spring 346 to disengage the first pin 352 from the second recess 328, and thereby releasing the security module 340 from the lock-in position. This, then allows the handle 312 to be moved so that the latch module 330 may be moved to the unlatched configuration to release the second object.

In some examples, the motor 364 may push the sliding component 362 until the reflector 370 reaches a second position which is aligned to the second sensor 376B. In such examples, after some predefined timer clock, for example, after 10 minutes, if there is no signal from the management system to retract the sliding component 362 back to a first position which is aligned to the first sensor 376A, the controller 372 may send another signal to the motor 364 to retract the sliding component 362 back to the first position. In other words, the sliding movement of the sliding component 362 may result in moving the reflector 370 from the second position to the first position, which is aligned to the first sensor 376A. The movement of the sliding component 362 from the motor 364, may result in rotating the lock member 344 in the second direction 384B opposite to the first direction 384A, which may result in releasing the counter biasing force applied on the tension spring 346, thereby re-engaging the first pin 352 to the second recess 328 and holding the security module 340 in the lock-in position.

Figure 4E:
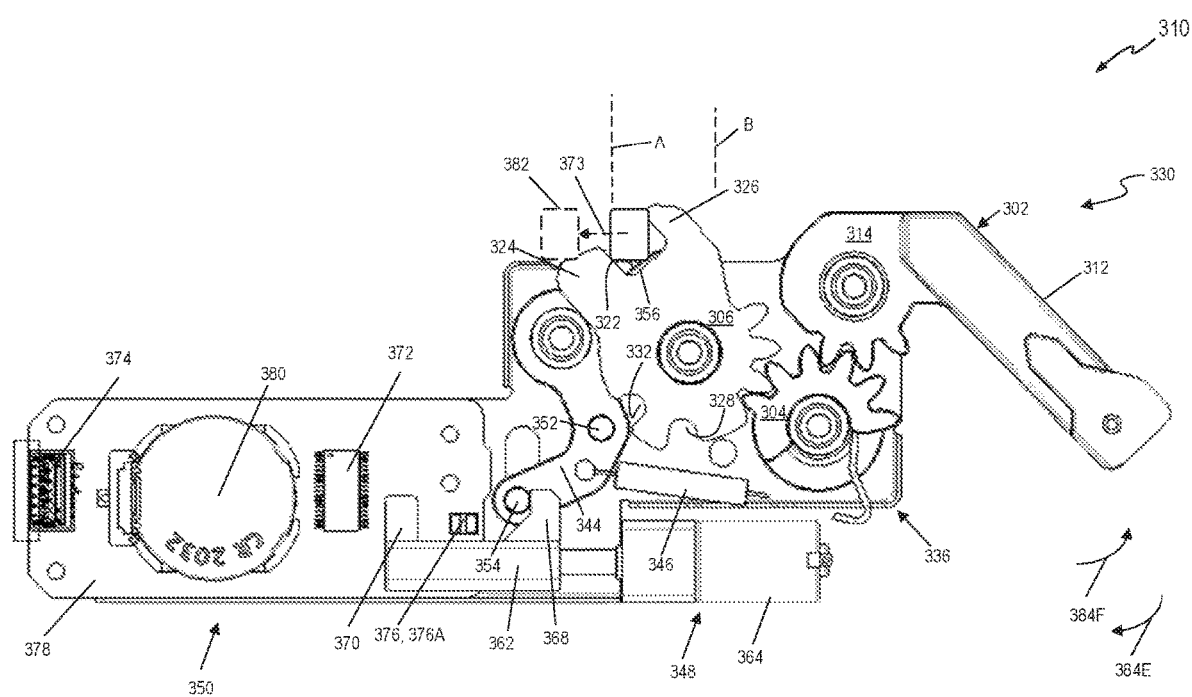
FIG. 4E illustrates a top view of the electronic lock of FIG. 3B having the security module released from a lock-in position and the latch module released from the lock-out position when the latch module is in an unlatched configuration, accordingly to some examples of the present disclosure.

Referring to FIG. 4E, when the security module 340 is released from the lock-in position, the handle 302 may be rotated along the sixth direction 384F to move the latch module 330 from the latched configuration to the unlatched configuration, thereby releasing the second object. For example, the receiver 306 may be rotated by the application of the rotational force on the lever portion 312 of the handle 302 via the torque portion 302 and the torque member 304. When the latch module 330 is transitioned from the latched configuration to the unlatched configuration, the second lobe 326 of the receiver 306 may move the anchor point 382 from the second position "B" to the first position "A", and thereby allowing the anchor point 382 to be decoupled from the first recess 322. In the unlatched configuration of the latch module 330, the first lobe 324 is titled downwards to allow the second object containing the anchor point 382 to be pushed outside the first recess 322, as shown by dotted line 373, thereby removing the anchor point 382 from the latch module 330.

In some examples, the actuator 348 is activated based on a signal received from the controller 372 to rotate the lock member 344 along the first direction 384A when the latch module 330 is in the latched configuration to disengage the first pin 352 from the second recess 328, and release the security module 340 from the lock-in position, as shown in FIG. 4D. Similarly, the actuator 348 is activated based on the signal received from the controller 372 to rotate the lock member 344 along the second direction 384B opposite to the first direction 384A such that the tension spring 346 re-engage the first pin 352 to the second recess 328 when the latch module 330 is in the latched configuration, and hold the security module 340 in the lock-in position, as shown in FIG. 4C. Further, the actuator 348 is activated based on the signal received from the controller 372 to rotate the lock member 344 along the second direction 384B such that the tension spring 346 engage the first pin 352 to the third recess 332 when the latch module 330 is in the unlatched configuration, and hold the latch module 330 in the lock-out position, as shown in FIG. 4A.

Figure 5A:
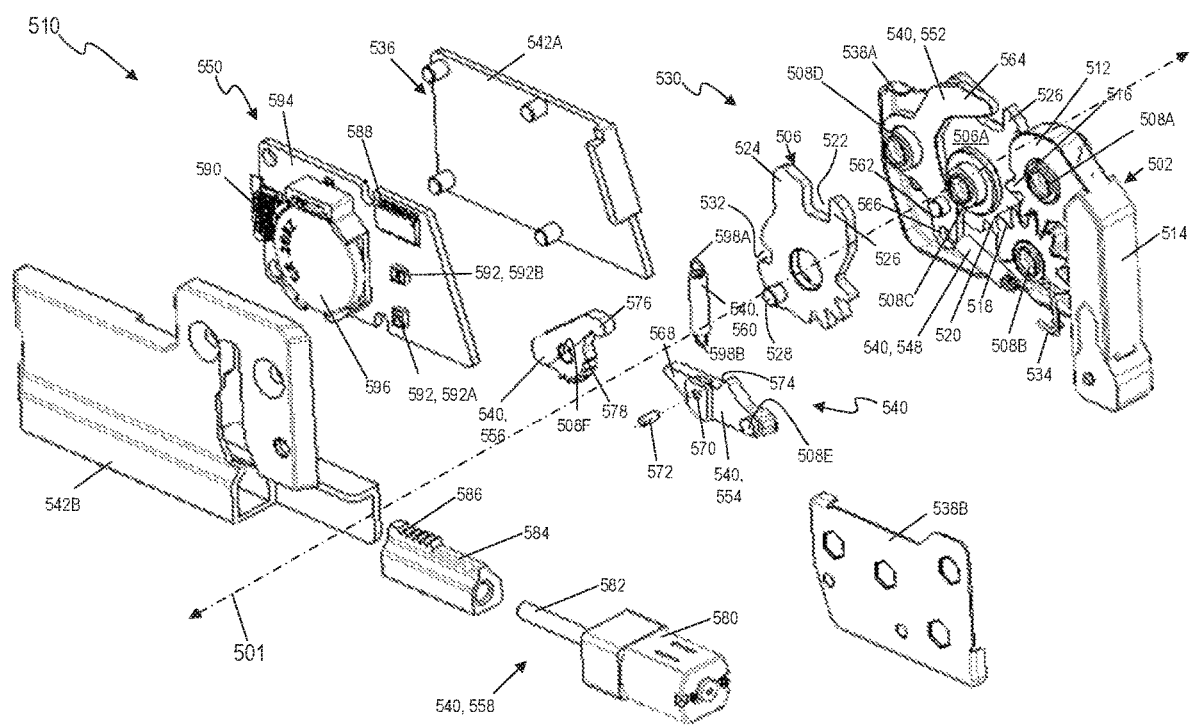
FIG. 5A illustrates an exploded view of an electronic lock, according to another example of the present disclosure.
Figures 5B, 5C:
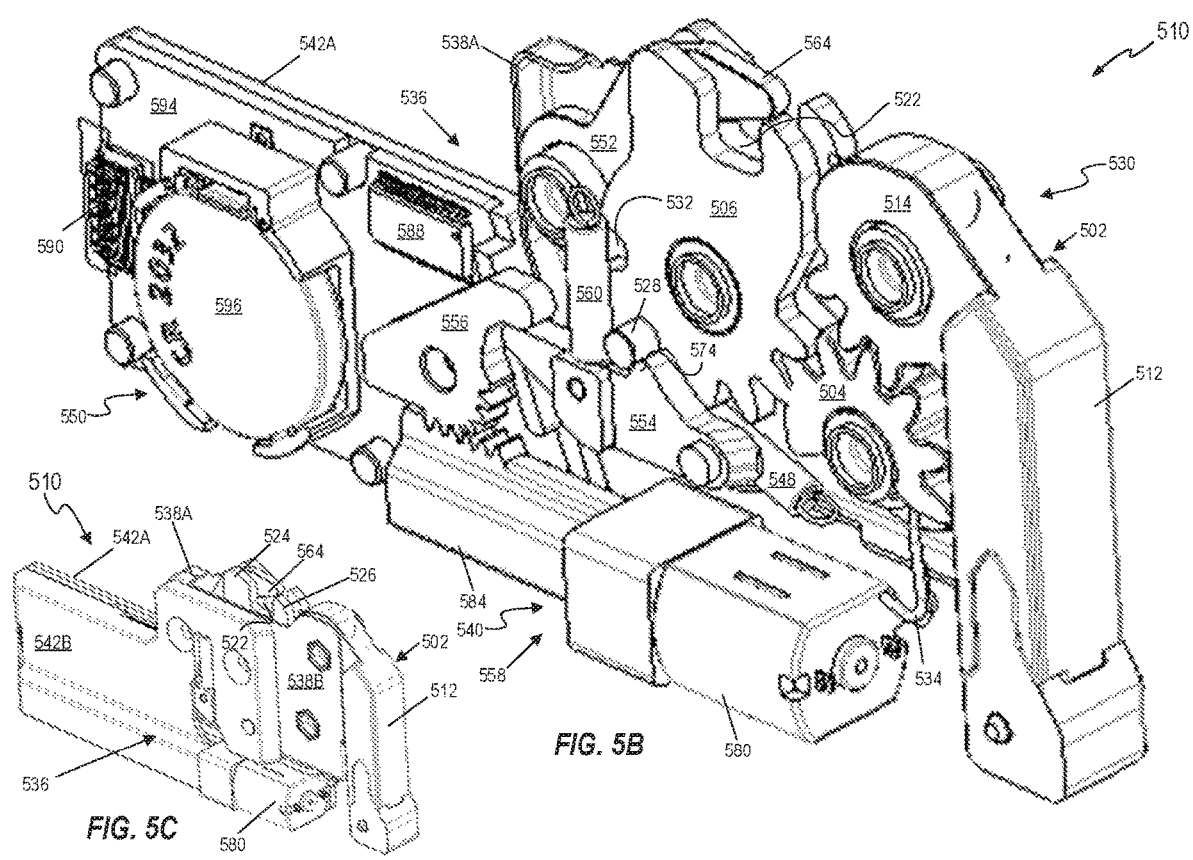
FIG. 5B illustrates an assembled view of the electronic lock of FIG. 5A, according to another example of the present disclosure.
FIG. 5C illustrates the assembled view of the electronic lock of FIG. 5B having a housing, according to another example of the present disclosure.

FIG. 5A is an exploded view of an electronic lock 510 in accordance to another example of the present disclosure. FIG. 5B is an assembled view of the electronic lock 510 of FIG. 5A in accordance to another example of the present disclosure. The electronic lock 510 is assembled relative to an axis 501 (as shown in FIG. 5A). FIG. 5C is the assembled view of the electronic lock 510 of FIG. 5B having a housing 536, according to another example of the present disclosure.

As discussed hereinabove, the electronic lock 510 includes a latch module 530, a security module 540, and a controller assembly 550. In some examples, the security module 540 is electrically and communicatively coupled to the control assembly 550 and detectably engaged to the latch module 530. For example, the electronic lock 510 may fasten an electronic device 205 (as shown in FIG. 2) to an enclosure or a rack of a data center, in a latched configuration of the latch module 530, and the security module 540 may then lock the latch module 530 in the latched configuration (i.e., by moving the security module 540 to a lock-in position) to prevent an unauthorized access to the electronic device. In some examples, the security module 540 electrically and communicatively coupled to the controller assembly 550 may receive signals from the controller assembly 550 to move the security module 540 to the lock-in position to prevent unauthorized access to the electronic device or release the security module 540 from the lock-in position to allow the authorized access to the electronic device.

The latch module 530 includes three rotatable components, a handle 502, a torque member 504, and a receiver 506, which are disposed on a separate shaft 508A, 508B, and 508C respectively that allows each of those components to rotate relative to the respective shafts. The shafts 508A, 508B, and 508C may be additionally used to fixedly secure the latch module 530 to the electronic device. Accordingly, the shaft 508A, 508B, and 508C may be hollow to allow a fastener such as a bolt, a screw, a rivet, or other fastener to pass through the respective shaft 508A, 508B, and 508C and may include a tapered crown to retain the fastener. The fastener may fixedly secure the latch module 530 to the electronic device.

The handle 502 may include a lever portion 512 and a torque portion 514. The lever portion 512 may provide a working surface for an application of a rotational force on the latch module 530, and the torque portion 514 may include a plurality of first gears 516. Further, the torque member 504 may include a plurality of second gears 518 that may be complementary to the plurality of first gears 516. In such examples, the plurality of second gears 518 may interface with the plurality of first gears 516. Additionally, the receiver 506 may include a plurality of third gears 520 that may be complementary to the plurality of second gears 518. In such examples, the plurality of third gears 520 may interface with the plurality of second gears 518.

It may be noted herein that the plurality of second gears 518 and the plurality of third gears 520 may be collectively referred to as a first pair of complementary gear features. In such examples, the torque member 504 is rotatably coupled to the receiver 506 by the first pair of complementary gear features. Similarly, the plurality of first gears 516 and the plurality of second gears 518 may be collectively referred to as a second pair of complementary gear features. In such examples, the torque portion 514 of the handle 502 is rotatably coupled to the torque member 504 by the second pair of complementary gear features. During operation, a rotational force may be applied on the lever portion 512 of the handle, and such rotational force applied on the lever portion 512 may be transferred to the receiver 506 via the torque portion 514 of the handle 502, and the torque member 504.

In some examples, the receiver 506 may include a first recess 522 formed between a first lobe 524 and a second lobe 526 of the receiver 506 for engaging an anchor point (not shown in FIG. 5A) of an object, such as an enclosure or a rack of the datacenter, within the first recess 522. The receiver 506 may further include a pin 528 and a second recess 532. The pin 528 is disposed adjacent to the plurality of third gears 520 and the second recess 532 is located between the first lobe 524 and the pin 528. In some examples, the pin 528 may extend outwardly from a surface of the receiver 506 and the first and second recesses 522, 532 are formed on the perimeter of the receiver 506. In the shown example, the receiver 506 is formed by two symmetrical pieces 506A, 506B, which are spaced apart from each other and coupled to the shaft 508C. It may be noted herein that the two symmetrical pieces 506A and 506B operates in tandem.

In some examples, the latch module 530 may further include a torsion spring 534 coupled to the torque member 504. The torsion spring 534 may be disposed within a recess of the torque member 504 and apply a bias force (spring force) to the torque member 504 in order to bias the latch module 530 towards an unlatched configuration when not in a latched configuration and to extend the lever portion 512 of the handle 502, when in the unlatched configuration. Accordingly, a first spring arm of the torsion spring 534 may be coupled to apply the bias force to the torque member 504, while a second spring arm of the torsion spring 534 may be coupled to apply a countervailing spring force to the housing 536.

Each of the handle 502, the torque member 504, the receiver 506, and the shafts 508A, 508B, 508C may include any suitable material(s) (e.g., metal, metal alloy, plastic, etc.) and may be formed using any suitable process. In some examples, the handle 502, the torque member 504, and the receiver 506 are formed of machined sheet metal such as cold rolled steel, hot rolled steel, stainless steel, aluminum, alloys thereof, and/or other sheet metal stock. In some examples, the handle 502, the torque member 504, and the receiver 506 are formed of cast metal and/or metal alloy such as aluminum, magnesium, copper, tin, zinc, iron, steel, other metals, and/or alloys thereof.

The security module 540 includes three rotatable components, for example, a first lock member 552, a second lock member 554, and a release member 556. The security module 540 further includes an actuator 558 and a first tension spring 548, and a second tension spring 560. The first lock member 552, the second lock member 554, and the release member 556 may be disposed on separate shafts 508D, 508E, 508F respectively that may allow each of those components to rotate relative to the respective shaft. Accordingly, the shafts 508D, 508E, 508F may be hollow to allow the fastener, such as the bolt, the screw, the rivet, or other fastener to pass through the respective shafts and may include the tapered crown to retain the fastener. The fastener may fixedly secure the first lock member 552, the second lock member 554, and the release member 556 to the electronic device. In one example, the first lock member 552, the second lock member 554, and the release member 556 are coupled to the respective shafts in such a manner as to allow the first lock member 552, the second lock member 554, and the release member 556 to rotate relative to the respective shaft. In another example, the first lock member 552, the second lock member 554, and the release member 556 are fixedly coupled to the respective shafts, and it is the respective shafts itself that rotates in order to rotate the first lock member 552, the second lock member 554, and the release member 556.

The first lock member 552 may have a "C" shaped profile. The first lock member 552 includes a pin 562 and a release lobe 564, and an opening 566. In some examples, the release lobe 564 and the opening 566 are located at mutually opposite ends of the first lock member 552. The pin 562 is located between the release lobe 564 and the opening 566. In such examples, the pin 562 extend outwardly from a surface of the first lock member 552. The first tension spring 548 is coupled to the opening 566 of the first lock member 552 and the housing 536.

The second lock member 554 includes a neck portion 568 at one end, an opening 570 at the mid-section, and a pin 572 to engage in the opening 570. The second lock member 554 further includes a lobe 574 located behind the neck portion 568. It may be noted herein that the lobe 574 may be a wall like structure.

The release member 556 includes a neck portion 576 and a plurality of fourth gears 578. The release member 556 may be rotatably engaged to the second lock member 554 so as to apply or transfer a rotational force on the second lock member 554 or release the rotational force applied on the second lock member 554. For example, the neck portion 576 of the release member 556 may be rotatably engaged to the neck portion 568 of the second lock member 554 to apply or transfer the rotational force on the second lock member 554 and release the applied rotational force on the second lock member 554.

The actuator 558 includes a motor 580 having a shaft 582 and a sliding component 584 having a plurality of fifth gears 586. The sliding component 584 is rotatably coupled to the shaft 582. The plurality of fifth gears 586 is located proximate to one end of the sliding component 584. In such examples, the plurality of fifth gears 586 may be engaged to the plurality of fourth gears 578 to rotatably couple the release member 556 to the sliding component 584.

The second tension spring 560 includes a first end 598A coupled to the housing 536 and a second end 598B coupled to the second lock member 554. For example, the pin 572 is coupled to the second end 598B. In some examples, the pin 572 may be disposed proximate to the neck portion 568 of the second lock member 554, and extends outwardly from a surface of the second lock member 554. During operation, the second tension spring 560 may apply a biasing force on the second lock member 554 so as to releasably engage the second lock member 554 to the receiver 506 of the latch module 530. The mechanism used to releasably engage the second lock member 554 to the receiver 506 is explained in greater details below.

In one or more examples, the motor 596, for example, a micro gear motor is electrically and communicatively coupled to the controller assembly 550 and configured to be actuated based on the signals received from the controller assembly 550. The controller assembly 550 includes a controller 588, power and signal interfaces 590, a pair of sensors 592 including a first sensor 592A and a second sensor 592B, a printed circuit card 594, and an onboard power backup 596, for example, a battery. The controller 588 may be communicatively coupled to the management controller 255A, 255B (as shown in FIG. 2) via the power and signal interfaces 590. The controller 588 is further electrically and communicatively coupled to the actuator 558, for example, to the motor 580 via the power and signal interfaces 590. The pair of sensors 592 may receive the position information of the sliding component 584 by receiving reflections from the sliding component 584 or the release member 556. The pair of sensors 592 may then send the received position information to the controller 588. In some examples, the controller 588 may actuate the motor 580 based on a predefined timer clock set by the user, or based on the valid user credentials received from the user. During operation, the motor 580 may slide the sliding component 584 from a first position aligned with the first sensor 592A and the reflector 556 may rotate from a second position aligned with the second sensor 592B. During such movement of the sliding component 584 which is rotatably engaged with the release member 556 may rotate the second lock member 554 to disengage the lobe 547 from the pin 528, and release the security module 540 from the lock-in position.

Each of the first lock member 552, the second lock member 554, the release member 556, the second tension spring 560, and the shafts 508D, 508E, and 508F may include any suitable material(s) (e.g., metal, metal alloy, plastic, etc.) and may be formed using any suitable process. In some examples, the first lock member 552, the second lock member 554, and the release member 556 are formed of machined sheet metal such as cold rolled steel, hot rolled steel, stainless steel, aluminum, alloys thereof, and/or other sheet metal stock. In some examples, the first lock member 552, the second lock member 554, and the release member 556 are formed of cast metal and/or metal alloy such as aluminum, magnesium, copper, tin, zinc, iron, steel, other metals, and/or alloys thereof.

In some examples, the torque member 504, the receiver 506, the first lock member 552, the second lock member 554, the release member 556, the second tension spring 560, the sliding component 584, the shafts 508A, 508B, 508C, 508D, 508E, 508F may be contained within the module housing 538. The module housing 538 may also include openings to accommodate and secure the shafts 508A-508F, a pin (not shown) to secure the first end 598A of the second tension spring 560, as well as openings for alignment and other purposes. In some examples, the module housing 538 may include any suitable material(s) (e.g., metal, metal alloy, plastic, etc.) and may be formed using any suitable process. In some examples, the module housing 538 is formed of machined sheet metal such as cold rolled steel, hot rolled steel, stainless steel, aluminum, alloys thereof, and/or other sheet metal stock. In some examples, the module housing 538 is formed of cast metal and/or metal alloy such as aluminum, magnesium, copper, tin, zinc, iron, steel, other metals, and/or alloys thereof. In some examples, the module housing 538 includes two separate pieces a back housing 538A and a front housing 538B. The back housing 538A and the front housing 538B may each include openings to accommodate and secure the latch module 530 and the security module 540 components, as well as openings for alignment and other purposes.

The controller 588, the power and signal interfaces 590, the pair of sensors 592, the printed circuit card 594, and the onboard power backup 596 are disposed within the controller housing 542. The controller housing 542 may include any suitable material(s) (e.g., metal, metal alloy, plastic, etc.) and may be formed using any suitable process. In some examples, the controller housing 542 is formed of machined sheet metal such as cold rolled steel, hot rolled steel, stainless steel, aluminum, alloys thereof, and/or other sheet metal stock. In some examples, the controller housing 542 is formed of cast metal and/or metal alloy such as aluminum, magnesium, copper, tin, zinc, iron, steel, other metals, or alloys thereof. In some examples, the controller housing 542 includes two separate pieces a back housing 542A and a front housing 542B. The back housing 542A and the front housing 542B may each include openings to accommodate and secure the components of the controller assembly 550 as well as openings for alignment and other purposes. The module housing 538 and the controller housing 542 collectively defines the housing 536 of the electronic lock 510.

In some examples, the latch module 530 (and by extension the receiver 506, the torque member 504, and the handle 502) and the security module 540 (and by extension the first and second lock members 552, 554, the tension spring receiver member 556, the actuator 558, and the second tension spring 560) may be fixedly coupled to a first object (i.e., an electronic device, for example, a compute node or a storage node or other object) such that the back housings 538A, 542A is in contact with the first object. Later, the electronic lock 510, which is rigidly coupled to the electronic device is disposed in the enclosure or the rack to latch/fasten the electronic device to an anchor point 598 of the enclosure or the rack using the latch module 530, and secure/lock the electronic device in the latched configuration using the security module 540.

FIG. 5B shows the assembled view of the electronic lock 510, where the latch module 530 is in the latched configuration and the security module 540 is in the lock-in position. In the shown example of FIG. 5B, the printed circuit card 594 is coupled to the back housing 542A, and the first, second lock members 552, 554, the torque portion 514, and the torque member 504 are rotatably disposed in the back housing 538A. Further, the handle portion 512 and the torque portion 514 of the handle 502 are movably coupled to one another. The torque portion 514 is rotatably coupled to the torque member 504. The receiver 506 is rotatably coupled to the torque member 504. The torsion spring 534 is coupled to the torque member 504 and the motor 580. The first and second lock members 552, 554 are detachably engaged to the receiver 506. In particular, the pin 562 of the first locking member 552 is configured to engage with the second recess 532, and the pin 528 of the receiver 506 is configured to engage with the lobe 574 of the second lock member 554. In such examples, the first tension spring 548 is coupled to the first lock member 552 to apply a biasing force on the first lock member 552 to engage the pin 562 with the second recess 532, and hold the latch module 530 in a lock-out positon when the latch module 530 is in unlatched configuration. Similarly, the second tension spring 560 is coupled to the second lock member 554 to apply the biasing force on the second lock member 554 to engage the pin 528 with the lobe 574 and hold the security module 540 in a lock-in position when the latch module 530 is in a latched configuration. The receiver member 556 is rotatably engaged with the second lock member 554. Further, the sliding component 584 is coupled to the shaft 582 (as shown in FIG. 5A) of the motor 580 and rotatably engaged with the receiver member 556. The motor 580 is configured to apply the rotational force on the second lock member 554 via the sliding component 584 and the release member 556.

FIG. 5C shows the electronic lock 510 having the housing 536 covering substantially all components of the electronic lock 510 other then the motor 580, the lever portion 512 of the handle 502, the first and second lobes 524, 526, the first recess 522, and the release lobe 564 of the first lock member 552. The second lock member 554, the release member 556, and the second tension spring 560 are disposed within the front housing 538B. In such examples, the front housings 538B, 542B are then disposed over the respective back housings 538A, 542A such that the sliding component 584 (as shown in FIG. 5B) of the security module 540 is located on a bottom section of the front housing 542B. The sliding component 584 is configured to slide over the bottom section of the front housing 542B.

Figure 6A:
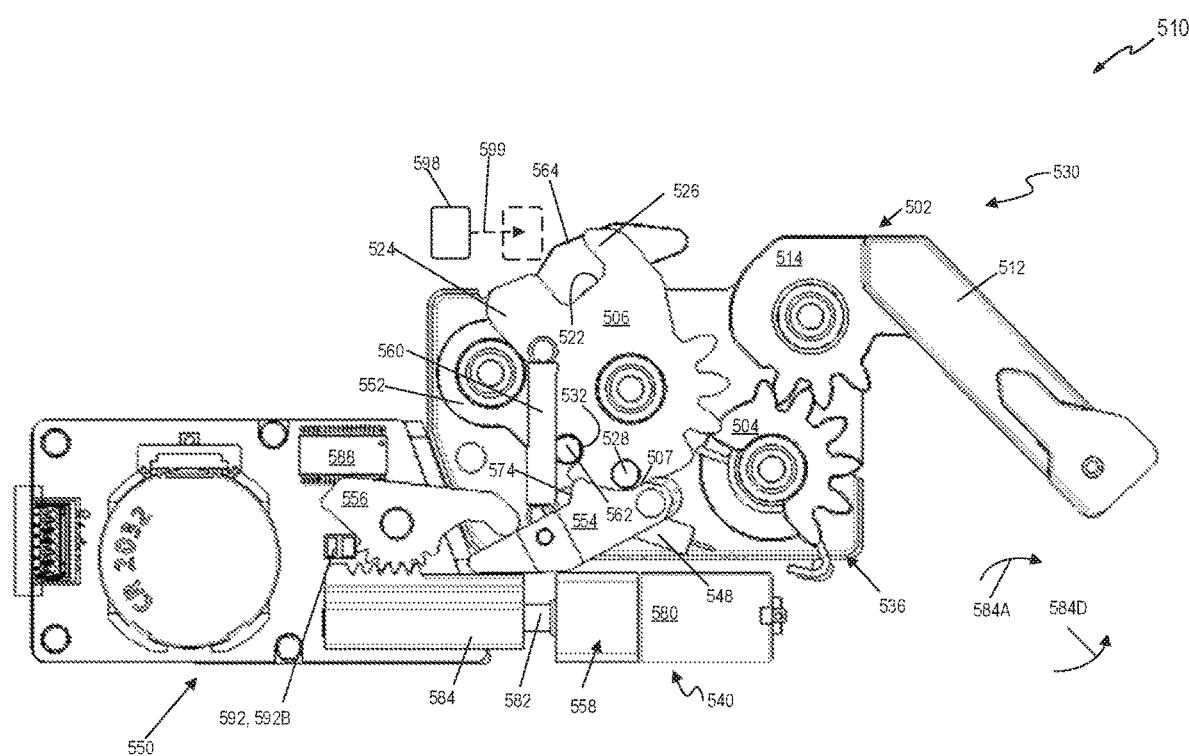
FIG. 6A illustrates a top view of the electronic lock of FIG. 5B having a latch module held in a lock-out position and a security module released from a lock-in position while the latch module in an unlatched configuration, according to some examples of the present disclosure.
Figure 6B:
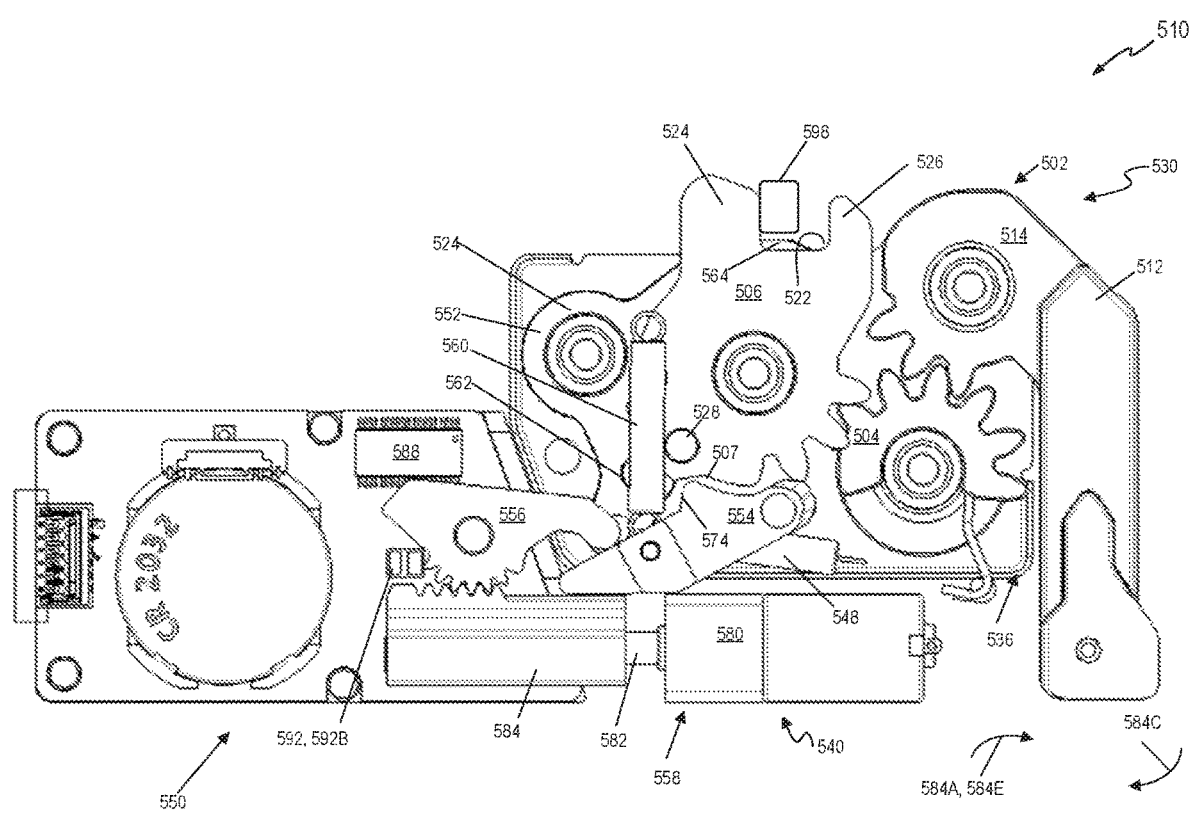
FIG. 6B illustrates a top view of the electronic lock of FIG. 5B having a security module released from a lock-in position while a latch module is in a latched configuration, according to some examples of the present disclosure.
Figure 6C:
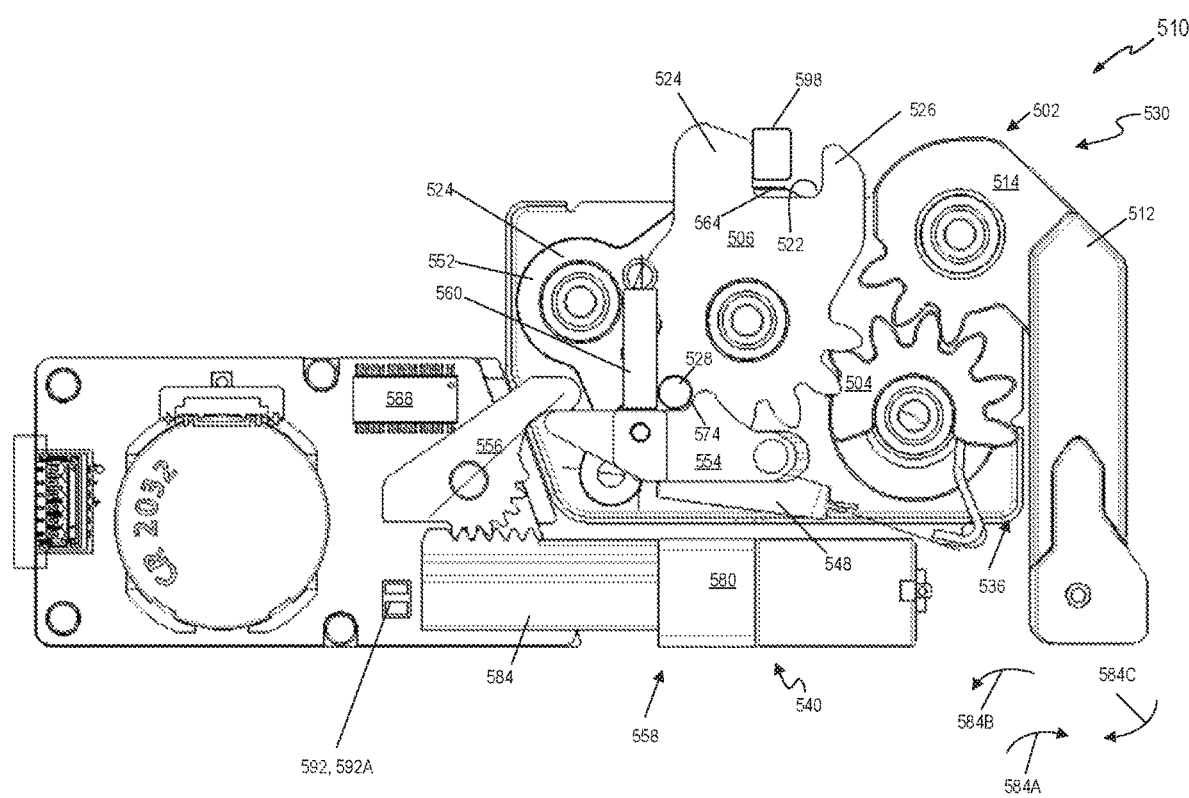
FIG. 6C illustrates a top view of the electronic lock of FIG. 5B having a security module held in a lock-in position while the latch module is in a latched configuration, according to some examples of the present disclosure.

FIGS. 6A, 6B, and 6C illustrate a top view of the electronic lock 510 of FIG. 5B having a latch module 530, security module 540, and a controller assembly 550 in accordance to some examples of the present disclosure. FIG. 6A illustrates the latch module 530 held in a lock-out position, while the latch module 530 is in an unlatched configuration. FIG. 6B shows the latch module 530 released from the lock-out position, while the latch module is in a latched configuration. FIG. 6C shows the security module 540 held in the lock-in position, while the latch module 530 is in the latched configuration.

As discussed hereinabove in the example of FIG. 5B, the latch module 530 includes a handle 502, a torque member 504, and a receiver 506. The handle 502 includes a lever portion 512 and a torque portion 514. The security module 540 includes a first lock member 552, a second lock member 554, a release member 556, and an actuator 558, a first tension spring 548, and a second tension spring 560. The actuator 558 includes a motor 580 and a sliding component 584. The controller assembly 550 includes a controller 588, power and signal interfaces 590, a pair of sensors 592 including a first sensor 592A and a second sensor 592B, a printed circuit card 594, and an onboard power backup 596, for example, a battery.

In some examples, the motor 580 is rotatably coupled to the sliding component 584 via the shaft 582. Further, the sliding component is rotatably coupled to the release component 556 via the plurality of fourth and fifth gears 578, 586 respectively. The release member 556 is rotatably engaged to the second lock member 554 via the neck portions 576, 568 respectively. The second tension spring 560 is coupled to the second lock member 554. Further, the lever portion 514 of the handle 502 is rigidly coupled to the torque portion 512 of the handle 502. The torque portion 512 is rotatably coupled to the torque member 504 via the plurality of first and second gears 516, 518 respectively. The torque member 504 is further rotatably coupled to the receiver 506 via the plurality of second and third gears 518, 520 respectively.

Referring to FIG. 6A, the actuator 558 may receive a signal from the controller assembly 550, for example, from the controller 588 to release the security module 540 from the lock-in position. In such examples, the motor 580 may apply a rotational force on the second lock member 554 along a first direction 584A via the sliding component 584 and the release member 556 to disengage the second lock member 554 from the release member 506. In particular, the application of the rotational force on the second lock member 554 may disengage the lobe 574 from the pin 528. Further, the application of the rotational force on the second lock member 554 also generates a counter biasing force on the second tension spring 560 via the second lock member 554 to disengage the lobe 574 from the pin 528, and thereby release the security module 540 from the lock-in position.

Referring to FIG. 6A again, while the security module 540 is released from the lock-in position, the handle 502 may be rotated along a fourth direction 584D to move the latch module 530 to an unlatched configuration. For example, the receiver 506 is rotated by the application of the rotational force on the lever portion 512 of the handle 502 via the torque portion 514 and the torque member 504, such that the pin 528 of the receiver 506 may freely roll over a tail portion 507 of the second lock member 554.

In the example of the FIG. 6A, the pin 562 is engaged to the second recess 532 and the first tension spring 548 applies the biasing force on the first lock member 552 to hold the latch module 530 in lock-out position. The pin 562 when engaged with the second recess 532 may prevent the handle 502, the torque member 504, and the receiver 506 from rotating, and thereby prevent the latch module 530 from transitioning from the unlatched configuration to the latched configuration in response to a force applied to the lever portion 512 of the handle 502. Thus, an operator/user may grasp and torque the lever portion 512 when aligning a first object containing the electronic lock 510 with a second object containing an anchor point 598 without accidentally closing the latch module 530.

Further, when the latch module 530 is in the unlatched configuration, the first lobe 524 is titled downwards to allow an introduction of the anchor point 598 within the first recess 522 of the receiver 502. Subsequently, the anchor point 598 is introduced within the first recess 522 of the receiver 502, as shown by the reference numeral 599, such that the anchor point 598 is in contact with the release lobe 564. The latch module 530 may then be transitioned to the latched configuration as shown in FIG. 6B.

Referring to FIG. 6B, the anchor point 598 may push the release lobe 564 to cause the first lock member 552 to rotate along a fifth direction 584E. The rotation of the first lock member 552 causes the pin 562 to disengage from the second recess 532, and thereby release the latch module 530 from the lock-out position. In such an arrangement, the first lock member 552 applies the counter biasing force on the first spring 548. Subsequently, the actuator 558 may receive the signal from the controller assembly 550, for example, from the controller 588 to retain the security module 540 in the lock-in position. In such examples, the motor 580 may continue to hold the security module 540 in the lock-in position by the application of the rotational force on the second lock member 554 along the first direction 584A via the sliding component 584 and the release member 556. While the security module 540 is still held in the lock-in position, the handle 502 is rotated along a third direction 584C opposite to the fourth direction 584D, to move the latch module 530 to a latched configuration. For example, while the anchor point 598 is introduced within the recess 522 (as shown in FIG. 4A), the rotational movement of the receiver 506 by the lever portion 512, the torque portion 514, and the torque member 504 causes the first lobe 524 to engage the anchor point 582 within the recess 522 and fasten a first object containing the latch module 530 to a second object containing the anchor point 582.

Referring to FIG. 6C, the first lobe 524 fastens the anchor point 598 in the latched configuration by the application of the rotational force on the lever portion 512 along the third direction 584C, via the torque portion 514, the torque member 504, and the receiver 506. The actuator 558 may receive the signal from the controller assembly, for example, the controller 588 to move the security module 540 to the lock-in position. In such examples, while the latch module 530 is held in the latched configuration, the actuator 558 may retract the rotational force applied on the first lock member 554 along a second direction 584B opposite to the first direction 584A, to engage the lobe 574 to the pin 528. In particular, the retraction of the application force applied on the first lock member 554 may engage the lobe 574 to the pin 528. Further, the retraction of the rotational force on the first lock member 554 may result in releasing the counter biasing force on the second tension spring 560 to once again engage the lobe 574 to the pin 528, thereby holding the security module 540 in the lock-in position.

Thus, the biasing force applied by the second tension spring 560 on the first lock member 554 holds the security module 540 in the lock-in position, while the counter biasing force applied by the second lock member 554 on the second tension spring 560 releases the security module 540 from the lock-in position. Similarly, the rotational force applied to the handle 502 in the third direction 584C may cause the latch module 530 to transition to the latched configuration, while the rotational force applied to the handle 502 in the fourth direction 584D opposite the third direction 584C may cause the latch module 530 to transition to the unlatched configuration.

Accordingly, a security system having an electronic lock including a controller assembly may prevent unauthorized access of each of a plurality of electronic devices installed in a data center. Further, the security system having a security coordinator module may also prevent theft or tampering of each of the plurality of electronic devices. Further, the security system allows to manage and control access on a data center level by interfacing with a management system.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. An electronic lock for securing an electronic device in an installed position in a structure, comprising:
   a latch module configured to be attached to the electronic device and comprising:
      a receiver comprising a first recess, a second recess, and a lobe, wherein the first recess is configured to receive an anchor point of the structure when the electronic device is in the installed position;
      a torque member rotatably coupled to the receiver; and
      a handle comprising a torque portion rotatably coupled to the torque member and a lever member extending from the torque portion, the handle being actuatable to move the latch module between a latched configuration in which the lobe blocks removal of the anchor point from the first recess and an unlatched configuration in which the lobe does not block removal of the anchor point from the first recess; and
   a security module releasably engaged to the latch module, wherein the security module comprises:
      a lock member comprising a first pin and a second pin, wherein the lock member is rotatable to selectively engage the first pin with the receiver, wherein the first pin is engageable with the second recess to establish a lock-in position of the security module in which the lock member prevents the latch module from transitioning from the latched configuration to the unlatched configuration;
      a tension spring coupled to the lock member to bias the lock member towards engagement of the first pin with the receiver; and
      an electronic actuator comprising a sliding component, wherein the electronic actuator is configured to, in a locked-in position of the security module, linearly translate the sliding component in a first direction relative to the lock member such that the sliding component pushes the second pin causing the lock member to rotate to disengage the first pin from the second recess and release the security module from the lock-in position.

2. The electronic lock of claim 1,
   wherein the receiver comprises a third recess;
   wherein the first pin is engageable with the third recess to establish a lock-out position of the security module in which the lock member prevents the latch module from transitioning from the unlatched configuration to the latched configuration; and
   wherein the electronic actuator is configured to linearly translate the sliding component in a second direction relative to the lock member such that the second pin is allowed move along the second direction and the tension spring is allowed to rotate the lock member to engage the first pin with the second recess if the latch module is in the latched configuration of with the third recess if the latch module is in the unlatched configuration.

3. The electronic lock of claim 2, wherein the lock member comprises a release lobe configured to protrude into the first recess when the security module is in the lock-out position and to be movable downward out of the first recess by engagement with the anchor point as the anchor point is moved into the first recess, such that the movement of the release lobe rotates the lock member to disengage the first pin from the third recess and release the latch module from the lock-out position.

4. The electronic lock of claim 3, wherein in response to the latch module being transitioned to the latch configuration, the tension spring urges the lock member to rotate such that the first pin engages the second recess and the release lobe moves upwards.

5. The electronic lock of claim 3, wherein the handle is rotatable to move the latch module between the latched and unlatched configurations, and, in the lock-out position of the security module, the handle prevented from rotating to move the latch module to the latched configuration.

6. The electronic lock of claim 5, wherein in lock-in position of the security module, the handle is prevented from rotating to move the latch module to the unlatched configuration.

7. The electronic lock of claim 2, further comprising a controller assembly electrically and communicatively coupled to the security module to control the movement of the sliding component of the electronic actuator, wherein the controller assembly comprises a controller, power and signal interfaces, a pair of sensors, a printed circuit card, and an onboard power backup.

8. The electronic lock of claim 7, wherein the electronic actuator is activated based on a signal received from the controller to rotate the lock member along the first direction when the latch module is in the latched configuration to disengage the first pin from the second recess, and release the security module from the lock-in position.

9. The electronic lock of claim 1, wherein the torque member is rotatably coupled to the receiver by a first pair of complementary gear features and the torque portion of the handle is rotatably coupled to the torque member by a second pair of complementary gear features.

10. The electronic lock of claim 1, wherein the latch module further comprises a torsion spring coupled to the torque member to bias the latch module towards an unlatched configuration when not in the latched configuration.

11. A security system to control access to an electronic device in an installed position in a structure, comprising:
an electronic lock attached to the electronic device and comprising:
a latch module comprising:
a receiver comprising a first recess, a second recess, and a lobe, wherein the first recess is configured to receive an anchor point of the structure when the electronic device is in the installed position;
a torque member rotatably coupled to the receiver; and
a handle comprising a torque portion rotatably coupled to the torque member and a lever member extending from the torque portion, the handle being actuatable to move the latch module between a latched configuration in which the lobe blocks removal of the anchor point from the first recess and an unlatched configuration in which the lobe does not block removal of the anchor point from the first recess;
a security module releasably engaged to the latch module, wherein the security module comprises:
a lock member comprising a first pin, and a second pin, wherein the lock member is rotatable to selectively engage the first pin with the receiver, wherein the first pin is engageable with the second recess to establish a lock-in position of the security module in which the lock member prevents the latch module from transitioning from the latched configuration to the unlatched configuration;
a tension spring coupled to the lock member to bias the lock member towards engagement of the first pin with the receiver; and
an electronic actuator comprising a sliding component, wherein the electronic actuator is configured to, in a locked-in position of the security module, linearly translate the sliding component in a first direction relative to the lock member such that the sliding component pushes the second pin causing the lock member to rotate to disengage the first pin from the second recess and release the security module from the lock-in position; and
a controller assembly electrically and communicatively coupled to the security module, the controller assembly to receive access request to the electronic device, and, in response to determining the access request will be granted, send a signal to the electronic actuator to linearly translate the sliding component along the first direction to release the security module from the lock-in position; and
a security coordinator module communicatively coupled to the controller assembly via a management controller of the electronic device, the security coordinator module to monitor an access state of the electronic device, and trigger a security operation in response to detection of an unauthorized access to the electronic device.

12. The security system of claim 11, wherein the security coordinator module is to manage user access to the electronic device, record access events at the electronic device, and monitor and maintain software status of the electronic device.

13. The security system of claim 11, wherein the unauthorized access to the electronic device comprises physical tampering and electronic threats to the electronic device, and wherein the security operation comprises a security alarm, a surveillance action, or an active cryptographic zeroisation, in response to the unauthorized access.

14. The security system of claim 11, further comprising a user interface unit to request access to the electronic device, wherein the user interface unit includes at least one of a biometric scanner, a radio frequency identification (RFID), a passcode keypad, a contactless tag reader, and an access request button.

15. The security system of claim 11, wherein the electronic device comprises one or more of a rack mount device or a blade device and the structure comprises a rack or an enclosure.

16. The security system of claim 11, wherein the controller assembly comprises a controller, power and signal interfaces, a pair of sensors, a printed circuit card, and an onboard power backup.

17. The security system of claim 16, further comprising a management system communicatively coupled to the controller assembly via the security coordinator module and the management controller for managing a plurality of electronic devices, wherein the management system is to:
receive access state information, software status information, and network activity status information of the electronic devices from the security coordinator module; and
send access credentials and security response commands to the security coordinator module.

18. The security system of claim 11,
wherein the receiver comprises a third recess;
wherein the first pin is engageable with the third recess to establish a lock-out position of the security module in which the lock member prevents the latch module from transitioning from the unlatched configuration to the latched configuration; and
wherein the electronic actuator is configured to linearly translate the sliding component in a second direction relative to the lock member such that the second pin is allowed move along the second direction and the tension spring is allowed to rotate the lock member to engage the first pin with the second recess if the latch module is in the latched configuration or with the third recess if the latch module is in the unlatched configuration.

19. The electronic lock of claim 18, wherein the lock member comprises a release lobe configured to protrude into the first recess when the security module is in the lock-out position and to be movable downward out of the first recess by engagement with the anchor point as the anchor point is moved into the first recess, such that the movement of the release lobe rotates the lock member to disengage the first pin from the third recess and release the latch module from the lock-out position.

20. The electronic lock of claim 19, wherein in response to the latch module being transitioned to the latched configuration, the tension spring urges the lock member to rotate such that the first pin engages the second recess and the release lobe moves upwards.

* * * * *